(12) United States Patent
Todorokihara et al.

(10) Patent No.: US 10,305,499 B2
(45) Date of Patent: May 28, 2019

(54) FREQUENCY SYNTHESIZER

(71) Applicant: Seiko Epson Corporation, Tokyo (JP)

(72) Inventors: Masayoshi Todorokihara, Suwa (JP);
Aritsugu Yajima, Toyama (JP);
Tetsuro Matsumoto, Chino (JP)

(73) Assignee: Seiko Epson Corporation (JP)

( * ) Notice: Subject to any disclaimer, the term of this patent is extended or adjusted under 35 U.S.C. 154(b) by 28 days.

(21) Appl. No.: 15/349,220

(22) Filed: Nov. 11, 2016

(65) Prior Publication Data
US 2017/0141782 A1 May 18, 2017

(30) Foreign Application Priority Data

Nov. 13, 2015 (JP) ................................ 2015-223511
Nov. 7, 2016 (JP) ................................ 2016-217130

(51) Int. Cl.
| H03B 21/00 | (2006.01) |
| H03L 7/093 | (2006.01) |
| H03K 19/21 | (2006.01) |
| H03L 7/091 | (2006.01) |
| H03L 7/085 | (2006.01) |
| H03L 7/16  | (2006.01) |

(52) U.S. Cl.
CPC ............ *H03L 7/093* (2013.01); *H03K 19/21* (2013.01); *H03L 7/085* (2013.01); *H03L 7/091* (2013.01); *H03L 7/16* (2013.01); *H03L 2207/50* (2013.01)

(58) Field of Classification Search
CPC ...................................... H03L 7/093
USPC .......................................................... 327/107
See application file for complete search history.

(56) References Cited

U.S. PATENT DOCUMENTS

| 6,690,215 | B2 | 2/2004 | McCune, Jr. et al. |
| 6,717,998 | B2 | 4/2004 | Adachi et al. |
| 7,050,525 | B2 | 5/2006 | Adachi et al. |
| 7,110,486 | B2 | 9/2006 | Adachi et al. |
| 7,592,874 | B2 | 9/2009 | Wicpalek et al. |
| 7,805,273 | B2* | 9/2010 | Kurosawa ............ G06F 1/0342 702/106 |
| 9,231,613 | B2 | 1/2016 | Todorokihara |
| 2013/0113573 | A1* | 5/2013 | Frantzeskakis ...... H03K 3/0315 331/34 |

FOREIGN PATENT DOCUMENTS

| JP | 2001-237709 A | 8/2001 |
| JP | 2003-224478 A | 8/2003 |

* cited by examiner

*Primary Examiner* — Metasebia T Retebo
(74) *Attorney, Agent, or Firm* — Harness, Dickey & Pierce, P.L.C.

(57) ABSTRACT

A frequency synthesizer includes: an oscillating section that generates a first signal; a frequency ratio measuring section that measures a frequency ratio of the first signal and a second signal by using the first signal and the second signal; a comparing section that compares the frequency ratio, which is measured by the frequency measuring section, with a target value of a frequency ratio; and a filter that is disposed on a preceding stage of the comparing section. A frequency of the first signal of the oscillating section is adjusted on the basis of a comparison result of the comparing section.

12 Claims, 35 Drawing Sheets

| Fcj | ADVANCEMENT OF PERIOD OF Fxj |
|---|---|
| 0 | 0 |
| 1 | $3 + \frac{1}{7}$ |
| 2 | $6 + \frac{2}{7}$ |
| 3 | $9 + \frac{3}{7}$ |
| 4 | $12 + \frac{4}{7}$ |
| 5 | $15 + \frac{5}{7}$ |
| 6 | $18 + \frac{6}{7}$ |
| 7 | $22 + \frac{0}{7}$ |
| 8 | $25 + \frac{1}{7}$ |
| ⋮ | ⋮ |

FREQUENCY SYNTHESIZER

CROSS REFERENCE

This application claims the benefit of Japanese Application No. 2015-223511, filed on Nov. 13, 2015 and Japanese Application No. 2016-217130, filed on Nov. 7, 2016. The disclosures of the prior applications are hereby incorporated by reference herein in their entirety.

BACKGROUND

1. Technical Field

The present invention relates to a frequency synthesizer.

2. Related Art

Frequency synthesizers, each of which has a phase locked loop (PLL) for locking a phase of a signal or a frequency locked loop (FLL) for locking a frequency of a signal, have been known.

U.S. Pat. No. 6,690,215 discloses a configuration of the FLL for minimizing periodic quantization noise called idle tone. In U.S. Pat. No. 6,690,215, a delta sigma modulation signal is obtained by inputting a clock signal, which is output from a voltage control oscillator, to a frequency delta sigma modulation section (FDSM). The delta sigma modulation signal is input to a comparing section. Then, by generating the idle tone included in the delta sigma modulation signal at the time of locking a frequency of the clock signal and the idle tone of the opposite phase and inputting the idle tones to the comparing section, the comparing section eliminates the idle tones included in the delta sigma modulation signal.

U.S. Pat. No. 7,592,874 discloses a configuration of the PLL capable of locking the phase and locking the frequency of the clock signal by using a free-run counter and an accumulator.

In the apparatuses according to U.S. Pat. Nos. 6,690,215 and 7,592,874 mentioned above, it is possible to reduce a time period necessary for locking the frequency or the phase of the clock signal.

However, in the apparatus described in U.S. Pat. No. 6,690,215, a clock signal is assumed on the basis of the output of the frequency of the clock signal at the time of locking, and the idle tone of the opposite phase is generated. However, there is no fluctuation in an amplitude and a frequency component of the idle tone of the opposite phase. Hence, the fluctuation in the amplitude and the frequency component of the idle tone included in the delta sigma modulation signal in a case where the clock signal fluctuates is not dealt with, and the idle tone included in the delta sigma modulation signal cannot be eliminated. That is, two independent idle tones appear in the output, and as a result, a problem arises in that the idle tones increase.

The apparatus described in U.S. Pat. No. 7,592,874 has the same problem as the apparatus described in U.S. Pat. No. 6,690,215 mentioned above, except that the phase of the clock signal can be locked.

SUMMARY

An advantage of some aspects of the invention is to provide a frequency synthesizer with a simple configuration. The frequency synthesizer is capable of reducing a time period necessary for locking a frequency or a phase of a signal which is output from an oscillating section, minimizing idle tone even in a case where there is fluctuation in the signal which is output from the oscillating section at the time of locking, and effectively attenuating a frequency component which increases phase noise of the oscillating section.

The invention can be implemented as the following forms or application examples.

A frequency synthesizer according to an aspect of the invention includes: an oscillating section that generates a first signal; a frequency ratio measuring section that measures a frequency ratio of the first signal and a second signal by using the first signal and the second signal; a comparing section that compares the frequency ratio, which is measured by the frequency ratio measuring section, with a target value of a frequency ratio; and a filter that is disposed on a preceding stage of the comparing section. A frequency of the first signal of the oscillating section is adjusted on the basis of a comparison result of the comparing section.

With this configuration, with a simple configuration, the frequency of the first signal, which is output from the oscillating section, can be locked. Further, it is possible to reduce a time period necessary for the locking.

In this configuration, the idle tone (quantization noise caused by the idle tone) of the opposite phase does not occur. Therefore, even in a case where there is fluctuation in the first signal at the time of the locking, there is nothing that deteriorates steady-state characteristics in a manner similar to those of the related art. Consequently, even in a case where there is fluctuation in the first signal at the time of the locking, the idle tone does not increase.

The filter is able to effectively attenuate the frequency component that increases the phase noise of the oscillating section.

The comparing section is able to obtain a difference between the frequency, which is measured by the frequency ratio measuring section, and the target value of the frequency ratio. However, the filter is disposed on the preceding stage of the comparing section. Therefore, the filter removes the noise component from the output signal of the frequency ratio measuring section, and the signal, of which the SN ratio (signal-to-noise ratio) is improved, is input to the comparing section. A bit width of the signal, which is input to the comparing section, becomes larger than a bit width of the output signal of the frequency ratio measuring section through the processing in the filter. Therefore, it is possible to increase the bit width which represents a target value when the comparing section performs comparison. Hence, it is possible to increase an adjustment resolution without an examination such as providing a gain section, which increases the output signal of the frequency ratio measuring section by a predetermined value times its original, in the comparing section.

A frequency synthesizer according to another aspect of the invention includes: an oscillating section that generates a first signal; a frequency ratio measuring section that measures a frequency ratio of the first signal and a second signal by using the first signal and the second signal; a comparing section that compares the frequency ratio, which is measured by the frequency ratio measuring section, with a target value of a frequency ratio; and a filter that is disposed on a next stage of the comparing section. A frequency of the first signal of the oscillating section is adjusted on the basis of a comparison result of the comparing section.

With this configuration, with a simple configuration, the frequency of the first signal, which is output from the oscillating section, can be locked. Further, it is possible to reduce a time period necessary for the locking.

In this configuration, the idle tone (quantization noise caused by the idle tone) of the opposite phase does not occur.

Therefore, even in a case where there is fluctuation in the first signal at the time of the locking, there is nothing that deteriorates steady-state characteristics in a manner similar to those of the related art. Consequently, even in a case where there is fluctuation in the first signal at the time of the locking, the idle tone does not increase.

The filter is able to effectively attenuate the frequency component that increases the phase noise of the oscillating section. Then, the filter is disposed on the next stage of the comparing section. Thereafter, it is possible to effectively attenuate the frequency component which increases the phase noise of the oscillating section including a quantization noise component and the like occurring in the comparing section.

The comparing section is able to obtain a difference between the frequency, which is measured by the frequency ratio measuring section, and the target value of the frequency. However, a quantization error is large, and thus it is possible to minimize the number of bits represented in calculation.

In the frequency synthesizer according to the aspect of the invention, it is preferable that the frequency synthesizer further includes an integrating section that is interposed between the comparing section and the oscillating section, and a phase of the first signal of the oscillating section is adjusted on the basis of the comparison result of the comparing section.

With this configuration, with a simple configuration, the phase of the first signal, which is output from the oscillating section, can be locked. Further, it is possible to reduce a time period necessary for the locking.

A frequency synthesizer according to still another aspect of the invention includes: an oscillating section that generates a first signal; a frequency ratio measuring section that measures a frequency ratio of the first signal and a second signal by using the first signal and the second signal; a comparing section that compares the frequency ratio, which is measured by the frequency ratio measuring section, with a target value of a frequency ratio; a filter that is disposed on a preceding stage of the comparing section; and a control amount calculation section that calculates a control amount of the oscillating section on the basis of a comparison result of the comparing section. The control amount calculation section includes at least two different circuit sections selected from a first circuit section that outputs a predetermined value times the comparison result of the comparing section, a second circuit section group that is formed of a plurality of second circuit sections each of which integrates the comparison result of the comparing section a different predetermined number of times, and a third circuit section group that is formed of a plurality of third circuit sections each of which integrates the comparison result of the comparing section a different predetermined number of times. At least one of the frequency or the phase of the first signal of the oscillating section is adjusted on the basis of the control amount which is calculated by the control amount calculation section.

With this configuration, with a simple configuration, at least one of the frequency or the phase of the first signal, which is output from the oscillating section, can be locked. Further, it is possible to reduce a time period necessary for the locking.

Since there is a plurality of kinds of the circuit sections, an adjustment range of the gain increases, and thus stability, transient characteristics, steady-state characteristics, and the like can be improved.

In this configuration, the idle tone (quantization noise caused by the idle tone) of the opposite phase does not occur. Therefore, even in a case where there is fluctuation in the first signal at the time of the locking, there is nothing that deteriorates steady-state characteristics in a manner similar to those of the related art. Consequently, even in a case where there is fluctuation in the first signal at the time of the locking, the idle tone does not increase.

The filter is able to effectively attenuate the frequency component that increases the phase noise of the oscillating section.

The comparing section is able to obtain a difference between the frequency, which is measured by the frequency ratio measuring section, and the target value of the frequency. However, the filter is disposed on the preceding stage of the comparing section. Therefore, the filter removes the noise component from the output signal of the frequency ratio measuring section, and the signal, of which the SN ratio (signal-to-noise ratio) is improved, is input to the comparing section. A bit width of the signal, which is input to the comparing section, becomes larger than a bit width of the output signal of the frequency ratio measuring section through the processing in the filter. Therefore, it is possible to increase the bit width which represents a target value when the comparing section performs comparison. Hence, it is possible to increase an adjustment resolution without an examination such as providing a gain section, which increases the output signal of the frequency ratio measuring section by a predetermined value times its original, in the comparing section.

A frequency synthesizer according to yet another aspect of the invention includes: an oscillating section that generates a first signal; a frequency ratio measuring section that measures a frequency ratio of the first signal and a second signal by using the first signal and the second signal; a comparing section that compares the frequency ratio, which is measured by the frequency ratio measuring section, with a target value of a frequency ratio; a filter that is disposed on a next stage of the comparing section; and a control amount calculation section that calculates a control amount of the oscillating section on the basis of a comparison result of the comparing section. The control amount calculation section includes at least two different circuit sections selected from a first circuit section that outputs a predetermined value times the comparison result of the comparing section, a second circuit section group that is formed of a plurality of second circuit sections each of which integrates the comparison result of the comparing section a different predetermined number of times, and a third circuit section group that is formed of a plurality of third circuit sections each of which integrates the comparison result of the comparing section a different predetermined number of times. At least one of the frequency or the phase of the first signal of the oscillating section is adjusted on the basis of the control amount which is calculated by the control amount calculation section.

With this configuration, with a simple configuration, at least one of the frequency or the phase of the first signal, which is output from the oscillating section, can be locked. Further, it is possible to reduce a time period necessary for the locking.

Since there is a plurality of kinds of the circuit sections, an adjustment range of the gain increases, and thus stability, transient characteristics, steady-state characteristics, and the like can be improved.

In this configuration, the idle tone (quantization noise caused by the idle tone) of the opposite phase does not occur.

Therefore, even in a case where there is fluctuation in the first signal at the time of the locking, there is nothing that deteriorates steady-state characteristics in a manner similar to those of the related art. Consequently, even in a case where there is fluctuation in the first signal at the time of the locking, the idle tone does not increase.

The filter is able to effectively attenuate the frequency component that increases the phase noise of the oscillating section. Then, the filter is disposed on the next stage of the comparing section. Thereafter, it is possible to effectively attenuate the frequency component which increases the phase noise of the oscillating section including a quantization noise component and the like occurring in the comparing section.

The comparing section is able to obtain a difference between the frequency ratio, which is measured by the frequency ratio measuring section, and the target value of the frequency ratio. However, a quantization error is large, and thus it is possible to minimize the number of bits represented in calculation.

In the frequency synthesizer according to the aspect of the invention, it is preferable that the filter is disposed on the next stage of the control amount calculation section.

With this configuration, calculation is performed in a state where the quantization error is large until filtering processing is performed. However, it is possible to minimize the number of bits represented in the calculation. Therefore, the filter is disposed on the next stage of the control amount calculation section. As a result, it is possible to reduce a size of the calculation circuit in a range to the control amount calculation section.

The filter is disposed on the next stage of the control amount calculation section. Therefore, it is possible to effectively attenuate the frequency component which increases the phase noise of the oscillating section such as a quantization noise component occurring in the comparing section.

In the frequency synthesizer according to the aspect of the invention, it is preferable that the comparing section performs signal processing through signed binary representation.

With this configuration, it is possible to take a negative value, and thus it is possible to reduce the number of elements or the sizes of the elements in the circuit.

In the frequency synthesizer according to the aspect of the invention, it is preferable that the frequency ratio measuring section has a frequency delta sigma modulation section that performs frequency delta sigma modulation on one of the first signal and the second signal by using the other thereof.

With this configuration, with a simple configuration, it is possible to accurately measure the frequency ratio.

In the frequency synthesizer according to the aspect of the invention, it is preferable that the frequency delta sigma modulation section outputs an output signal on the basis of a bit stream format.

With this configuration, it is possible to simplify the signal processing circuit.

In the frequency synthesizer according to the aspect of the invention, it is preferable that the frequency delta sigma modulation section outputs an output signal on the basis of a data stream format.

With this configuration, it is possible to increase a dynamic range of the comparing section. Thus, it is possible to deal with even a case where there is large fluctuation in frequency.

In the frequency synthesizer according to the aspect of the invention, it is preferable that the frequency ratio measuring section has a plurality of the frequency delta sigma modulation sections which are connected in parallel.

With this configuration, it is possible to further reduce the idle tone. In a case where the number of the frequency delta sigma modulation sections is n (n is an arbitrary natural number of two or more), for example, it is possible to reduce the idle tone by a degree of $1/n^{1/2}$.

In the frequency synthesizer according to the aspect of the invention, it is preferable that the frequency ratio measuring section has a phase adjustment section that shifts a phase of at least one of the first signal or the second signal, which is input to the plurality of frequency delta sigma modulation sections, between the plurality of frequency delta sigma modulation sections.

With this configuration, it is possible to further reduce the idle tone. In a case where the number of the frequency delta sigma modulation sections is n (n is an arbitrary natural number of two or more), for example, it is possible to reduce the idle tone by a degree of $1/n$.

In the frequency synthesizer according to the aspect of the invention, it is preferable that the oscillating section has a digital analog converter that converts a digital signal into an analog signal, and a voltage control oscillator.

With this configuration, it is possible to digitalize adjustment of an oscillating frequency of the voltage control oscillator. Thus, consistency with the digital signal processing up to the preceding stage of the digital analog converter is favorable.

In the frequency synthesizer according to the aspect of the invention, it is preferable that the oscillating section has a digital control oscillator.

With this configuration, it is possible to obtain an output which is stable even in environmental changes such as a change in temperature.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a frequency synthesizer according to the invention will be described in detail on the basis of embodiments shown in accompanying drawings.

First Embodiment

Figure 1:
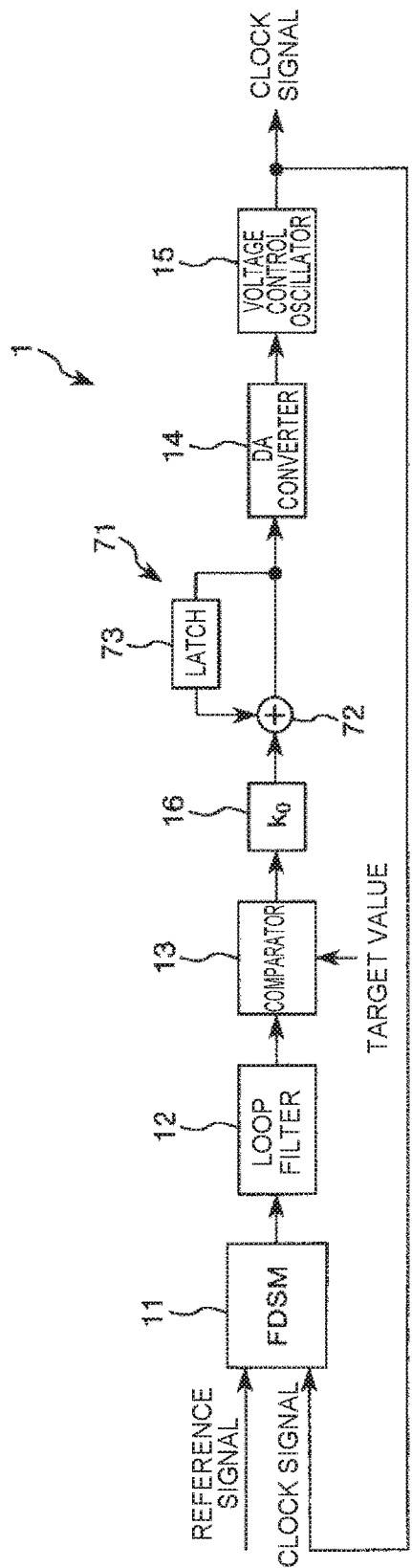
FIG. 1 is a block diagram illustrating a first embodiment of a frequency synthesizer according to the invention.
Figure 2:
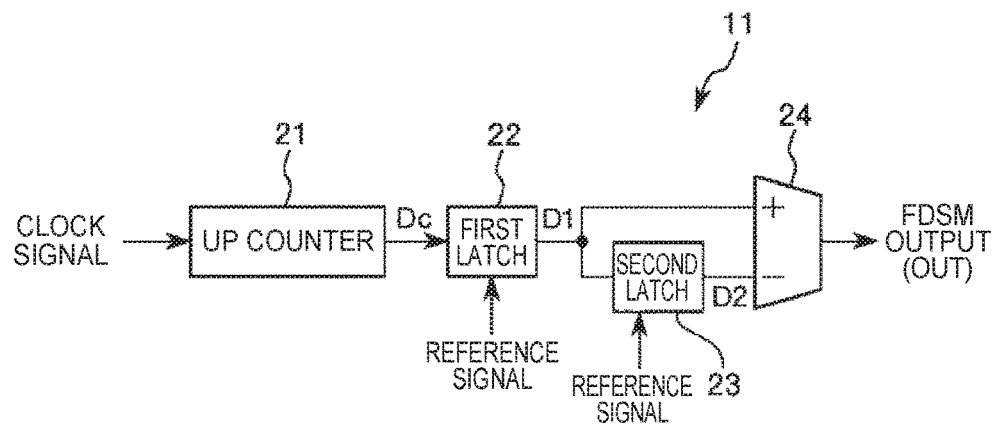
FIG. 2 is a block diagram illustrating a configuration example of an FDSM of the frequency synthesizer according to FIG. 1.
Figure 3:
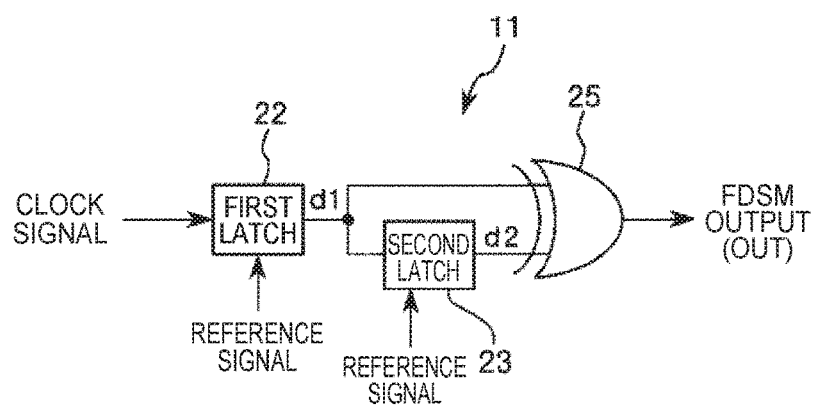
FIG. 3 is a block diagram illustrating a configuration example of an FDSM of the frequency synthesizer according to FIG. 1.

FIG. 1 is a block diagram illustrating a first embodiment of the frequency synthesizer of the invention. FIG. 2 is a block diagram illustrating a configuration example of an FDSM of the frequency synthesizer according to FIG. 1. FIG. 3 is a block diagram illustrating a configuration example of an FDSM of the frequency synthesizer according to FIG. 1.

As shown in FIG. 1, the frequency synthesizer 1 has a frequency delta sigma modulation section (hereinafter referred to as a "frequency delta sigma modulator (FDSM)") 11 which is an example of a frequency ratio measuring section (frequency modulation section), a loop filter (filter) 12, a comparator (comparing section) 13, a gain section 16 of which the gain is set as $k_0$, an integrating section 71, a digital analog converter (DA converter) 14, and a voltage control oscillator (VCO) 15. The FDSM 11, the loop filter 12, the comparator 13, the gain section 16, the integrating section 71, the DA converter 14, and the voltage control oscillator 15 are connected to the output side in this order. A value of the gain $k_0$ of the gain section 16 is not particularly limited, and is appropriately set in accordance with various conditions.

The DA converter 14 and the voltage control oscillator 15 constitute an oscillating section that generates a clock signal (first signal). With such a configuration, in this frequency synthesizer 1, it is possible to digitalize adjustment of an oscillating frequency of the voltage control oscillator 15. As a result, consistency with the digital signal processing up to the preceding stage of the DA converter 14 is favorable.

The loop filter 12 is disposed on the preceding stage of the comparator 13, that is, between the FDSM 11 and the comparator 13. The loop filter 12 is not particularly limited, and it is possible to use, for example, a lowpass filter, a lag-lead filter, or the like.

In the present embodiment, the integrating section 71 is formed of an adder 72 and a latch 73, is disposed at the next stage of the gain section 16, and is configured such that the adder 72 adds current data and data, which is previous by one piece to the current data and is latched on the latch 73.

The FDSM 11 is a circuit that performs frequency delta sigma modulation on one of a clock signal (first signal) and a reference signal (second signal), which are output from the voltage control oscillator 15, by using the other thereof, and that measures a frequency ratio of the clock signal and the reference signal by using the clock signal and the reference signal. In the present embodiment, typically, an exemplary case of performing the frequency delta sigma modulation on the clock signal by using the reference signal will be described. In addition, in a case of performing the frequency delta sigma modulation on the reference signal by using the clock signal, in the following description, it suffices that the reference signal and the clock signal are replaced with each other, and thus a description thereof will be omitted.

As the FDSM 11, for example, it is possible to use an FDSM (hereinafter referred to as an "FDSM (bit stream type FDSM) having a bit stream configuration") that outputs an output signal in a bit stream format, an FDSM (hereinafter referred to as an "FDSM (data stream type FDSM) having a data stream configuration") that outputs an output signal in a data stream format, and the like.

In a case of using the FDSM having the bit stream configuration, it is possible to simplify the signal processing circuit. Further, in a case of using the FDSM having the data stream configuration, it is possible to increase a dynamic range of the comparator 13. Thus, it is possible to deal with even a case where there is large fluctuation in frequency.

Next, the FDSM 11 having the data stream configuration and the FDSM 11 having the bit stream configuration will be described. First, the FDSM 11 having the data stream configuration will be described.

As shown in FIG. 2, the FDSM 11 having the data stream configuration includes: an up counter 21 that outputs count data Dc which indicates a count value by counting up rising edges of the clock signal; a first latch 22 that latches the count data Dc in synchronization with the rising edges of the reference signal and outputs first data D1; a second latch 23 that latches the first data D1 in synchronization with the rising edges of the reference signal and outputs second data D2; and a subtractor 24 that subtracts the second data D2 from the first data D1 and generates output data OUT. In addition, the first latch 22 and the second latch 23 are formed as, for example, D flip-flop circuits or the like.

The exemplary FDSM 11 is called a primary frequency delta sigma modulator, and latches a count value of the clock signal twice on the basis of an output reference signal, and sequentially holds the count values of the clock signal when the rising edges of the reference signal are set as triggers. In this example, it is assumed that the latch operation is performed at the rising edge. However, the latch operation may be performed at a falling edge or at both the rising edge and the falling edge. Further, the subtractor 24 calculates a difference between the held two count values, and outputs an increment in the count value of the clock signal, which is observed over time during transition of the reference signal for a single period, without a dead period in accordance with the passage of time. Assuming that a frequency of the clock signal is fx and a frequency of the reference signal is fc, a frequency ratio is represented by fx/fc. The FDSM 11 outputs the frequency ratio as a digital signal sequence.

The digital signal sequence is called a data sequence or a data stream. Further, the digital signal sequence, which is represented by a single bit to be described later, is called a bit sequence or a bit stream.

Next, the FDSM 11 having the bit stream configuration will be described.

As shown in FIG. 3, the FDSM 11 having the bit stream configuration includes: a first latch 22 that latches the clock signal in synchronization with the rising edge of the reference signal and outputs first data d1; a second latch 23 that latches the first data d1 in synchronization with the rising edge of the reference signal and outputs second data d2; and an exclusive OR circuit 25 that calculates a value of exclusive OR between the first data d1 and the second data d2 and generates output data OUT. In addition, the first latch 22 and the second latch 23 are formed as, for example, D flip-flop circuits or the like.

This FDSM 11 is different from the FDSM 11 having the data stream configuration in terms of the following. In the FDSM 11 having the data stream configuration, the first latch 22 holds the count data Dc, and outputs an increment of the count data Dc, which is obtained by counting up the rising edges of the clock signal observed over time during transition of the reference signal for the single period, as the output data OUT. In contrast, in this FDSM 11, the first latch 22 maintains the clock signal in a high or low state, and outputs the even or odd number of inversions, which is obtained over time during transition of the reference signal for the single period, as the output data OUT (outputs 0 if the number of inversions is even or outputs 1 if the number is odd).

However, the single period of the clock signal is formed of two operations of inversion transition between high and low. Therefore, a degree of change of the output data OUT caused by the fluctuation in the clock signal relative to the reference signal is twice a degree of change thereof in a case where the count value is held in the FDSM 11 having the data stream configuration. Accordingly, behavior of the idle tone in the FDSM 11 having the bit stream configuration coincides with behavior thereof in a case where the clock signal of twice the frequency is input to the FDSM 11 in the FDSM 11 having the data stream configuration. Regarding the FDSM 11 having the bit stream configuration, in view of the properties, as necessary, a frequency fx of the clock signal may be replaced with a frequency 2fx.

Next, operations of the frequency synthesizer 1 will be described.

As shown in FIG. 1, the reference signal (second signal) and the clock signal (first signal), which is output from the voltage control oscillator 15, are input to the FDSM 11 of the frequency synthesizer 1, and the FDSM 11 performs the above-mentioned predetermined processing.

A signal indicating the frequency, which is output from the FDSM 11, is input to the comparator 13 by performing the predetermined processing through the loop filter 12. For example, in a case of using a lowpass filter as the loop filter 12, the loop filter 12 cuts off or reduces a frequency component which is equal to or greater than a predetermined cutoff frequency. Further, a signal indicating a target value of the frequency is input to the comparator 13. Thus, the comparator 13 compares the target value with the frequency ratio indicated by the signal (precisely, a signal which becomes k times its original through the gain section 132) which is output from the loop filter 12.

A frequency ratio difference signal, which indicates a difference (deviation of the frequency ratio) between the target value as a comparison result of the comparator 13 and a frequency ratio indicated by the signal that is output from the FDSM 11, becomes $k_0$ times its original through the gain section 16, is integrated by the integrating section 71, is converted from a digital signal into an analog signal through the DA converter 14, and is input as a control voltage signal (control voltage) of the voltage control oscillator 15 to the voltage control oscillator 15. Thereby, the oscillating frequency of the voltage control oscillator 15, that is, the frequency of the clock signal, which is output from the voltage control oscillator 15, is adjusted, and is converged into (locked on) the target value.

As described above, according to the frequency synthesizer 1, with a simple configuration, the frequency of the clock signal, which is output from the voltage control oscillator 15, can be locked.

By using the FDSM 11, with a simple configuration, it is possible to accurately measure the frequency ratio. Further, it is possible to reduce a time period necessary for the locking.

In this configuration, the idle tone (quantization noise caused by the idle tone) of the opposite phase does not occur. Therefore, even in a case where there is fluctuation in the clock signal at the time of the locking, there is nothing that deteriorates steady-state characteristics. Consequently, even in a case where there is fluctuation in the clock signal at the time of the locking, it is possible to minimize the idle tone.

In fractional type PLL, fractional splices occur, but the frequency synthesizer 1 has a configuration in which fractional splices do not occur. Thereby, it is possible to realize a high accuracy frequency synthesizer.

The processed signal is a digital signal in a range to the preceding stage of the DA converter 14, and is therefore highly resistant to noise. Thereby, it is possible to obtain high accuracy.

The loop filter 12 is able to effectively attenuate a frequency component that increases the phase noise of the voltage control oscillator 15.

The comparator 13 is able to obtain a difference between the target value of the frequency and the frequency which is measured by the FDSM 11. However, the loop filter 12 is disposed on the preceding stage of the comparator 13. Therefore, the loop filter 12 removes the noise component from the output signal of the FDSM 11, and a signal, of which the SN ratio (signal-to-noise ratio) is improved, is input to the comparator 13. A bit width of the signal, which is input to the comparator 13, becomes greater than a bit width of the output signal of the FDSM 11 through the processing in the loop filter 12. Therefore, it is possible to increase the bit width which represents the target value when the comparator 13 performs comparison. Hence, it is possible to increase an adjustment resolution without an examination such as providing a gain section, which increases the output signal of the FDSM by a predetermined value times its original, in the comparator 13.

The DA converter 14 and the voltage control oscillator 15 may be replaced with a digital control oscillator (DCO) that controls the oscillating frequency on the basis of the digital signal. Likewise, also in the following embodiments, either combination of the DA converter and the voltage control oscillator or the digital control oscillator may be used.

The FDSM 11 may be replaced with a frequency ratio measuring section 5 according to the fifth embodiment to be described later or the frequency ratio measuring section 5 according to the sixth embodiment to be described later. Likewise, also in the following embodiments, any one of the FDSM having the bit stream configuration, the FDSM having the data stream configuration, the frequency ratio measuring section 5 according to the fifth embodiment, and the frequency ratio measuring section 5 according to the sixth embodiment may be used.

Not only the loop filter 12 but also a separate loop filter may be provided at a different position, for example, between the comparator 13 and the gain section 16, between the gain section 16 and the DA converter 14, or the like. Likewise, also in the following embodiments, not only the loop filter 12 but also the separate loop filter may be provided at a different position.

The comparator 13 may be configured to perform signal processing through signed binary representation. It is also the same for the following embodiments.

Second Embodiment

Figure 4:
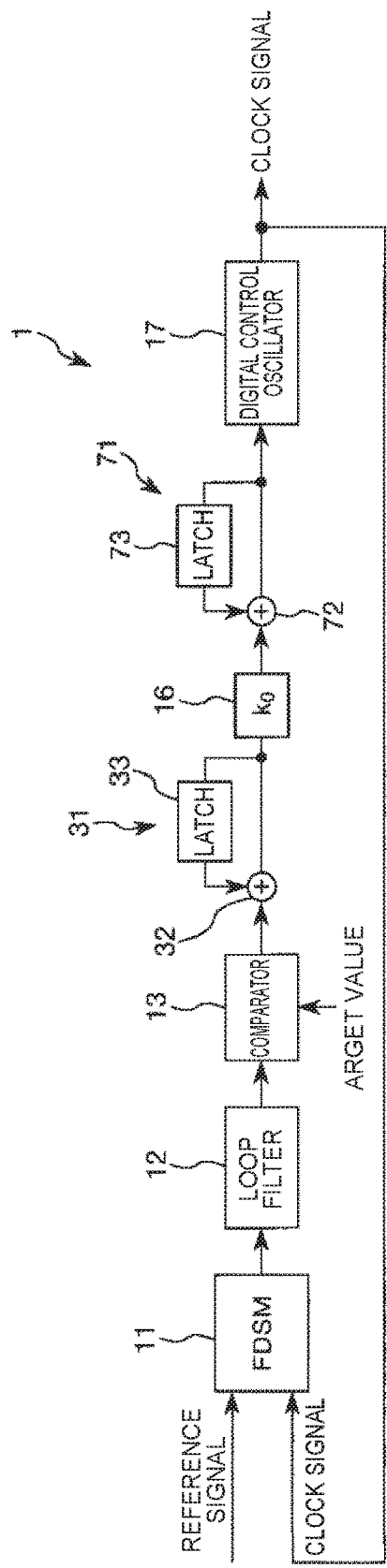
FIG. 4 is a block diagram illustrating a second embodiment of the frequency synthesizer according to the invention.

FIG. 4 is a block diagram illustrating a second embodiment of the frequency synthesizer according to the invention.

Hereinafter, the second embodiment will be described centering on different points between the above-mentioned first embodiment and the second embodiment, and the same points therebetween will not be described.

As shown in FIG. 4, the frequency synthesizer 1 of the second embodiment has the FDSM 11, the loop filter 12, the comparator 13, the integrating section 31, the gain section 16, the integrating section 71, and a digital control oscillator (DCO) 17 which is an example of the oscillating section and controls the oscillating frequency on the basis of the digital signal. The FDSM 11, the loop filter 12, the comparator 13, the integrating section 31, the gain section 16, the integrating section 71, the digital control oscillator 17 are connected to the output side in this order.

By using the digital control oscillator 17 as the oscillating section, it is possible to obtain an output which is stable even when there is environmental change such as temperature change.

The integrating section 31 has a function of integrating the input frequency so as to convert the frequency into a phase. In the present embodiment, the integrating section 31 is formed of an adder 32 and a latch 33, is disposed between the comparator 13 and the gain section 16 (digital control oscillator 17), and is configured such that the adder 32 adds current data and data, which is previous by one piece to the current data and is latched on the latch 33.

By providing the integrating section 31, the frequency synthesizer has a PLL function.

Thereby, a frequency ratio difference signal, which indicates a difference between the target value as a comparison result of the comparator 13 and a frequency ratio indicated by the signal that is output from the loop filter 12, is converted into a signal, which indicates the difference between phases, by the integrating section 31, and becomes $k_0$ times its original through the gain section 16, is integrated by the integrating section 71, and is input as a digital control signal of the digital control oscillator 17 to the digital control oscillator 17. Thereby, the oscillating frequency of the digital control oscillator 17, that is, the phase and the frequency of the clock signal, which is output from the digital control oscillator 17, are adjusted, and the phase is converged into a predetermined value, and the frequency is converged into the target value.

According to the above-mentioned second embodiment, it is also possible to exhibit the same effect as that of the above-mentioned first embodiment.

With a simple configuration, it is possible to lock the phase of the clock signal which is output from the digital control oscillator 17.

All the processed signals are digital signals, and are highly resistant to noise. Thereby, it is possible to obtain high accuracy.

Third Embodiment

Figure 5:
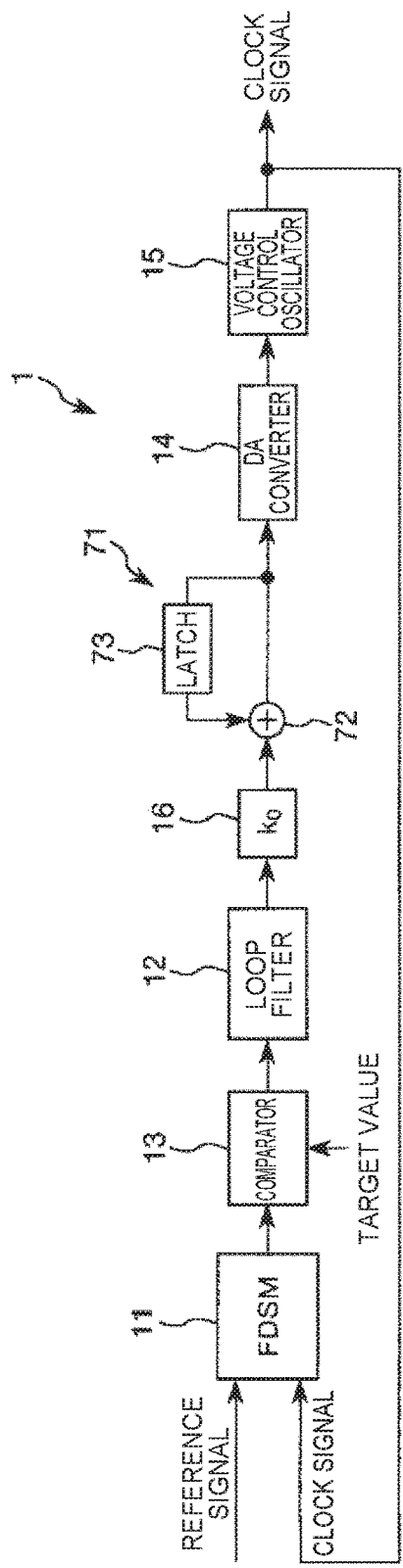
FIG. 5 is a block diagram illustrating a third embodiment of the frequency synthesizer according to the invention.
Figure 6:
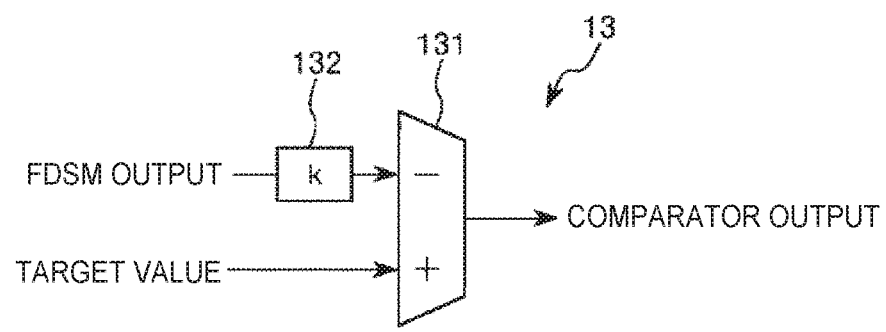
FIG. 6 is a block diagram illustrating a comparator of the frequency synthesizer according to FIG. 5.

FIG. 5 is a block diagram illustrating a third embodiment of the frequency synthesizer according to the invention. FIG. 6 is a block diagram illustrating a comparator of the frequency synthesizer according to FIG. 5.

Hereinafter, the third embodiment will be described centering on different points between the above-mentioned first embodiment and the third embodiment, and the same points therebetween will not be described.

As shown in FIG. 5, the frequency synthesizer 1 of the third embodiment has the FDSM 11, the comparator 13, the loop filter 12, the gain section 16, the integrating section 71, the DA converter 14, and the voltage control oscillator 15. The FDSM 11, the comparator 13, the loop filter 12, the gain section 16, the integrating section 71, the DA converter 14, the voltage control oscillator 15 are connected to the output side in this order.

As described above, in the present embodiment, the loop filter 12 is disposed on the next stage of the comparator 13, that is, between the comparator 13 and the voltage control oscillator 15, more specifically, between the comparator 13 and the gain section 16.

As shown in FIG. 6, the comparator 13 has a gain section 132, in which the gain is set as k, and a subtractor 131. A value of the gain k of the gain section 132 is not particularly limited, and is appropriately set in accordance with various conditions.

The signal (FDSM output), which is output from the FDSM 11, becomes k times its original through the gain section 132, and is input to the subtractor 131. Accordingly, the comparator 13 compares the target value of the frequency ratio with the frequency ratio which is output from the FDSM 11 and is indicated by the signal that becomes k times its original through the gain section 132. Further, the comparator 13 is configured to perform signal processing through signed binary representation.

According to the above-mentioned third embodiment, other than the effect caused by the position of the loop filter 12, the same effect as that of the above-mentioned first embodiment can be exhibited.

Since the loop filter 12 is disposed on the next stage of the comparator 13, it is possible to effectively attenuate the frequency component that increases the phase noise of the voltage control oscillator 15 including a quantization noise component and the like occurring in the comparator 13.

The comparator 13 is able to obtain a difference between the frequency, which is measured by the FDSM 11, and the target value of the frequency. However, a quantization error is large, and thus it is possible to minimize the number of bits represented in calculation.

By employing the signed binary representation, it is possible to take a negative value. Thereby, it is possible to reduce the number of elements or the sizes of elements in the circuit.

Fourth Embodiment

Figure 7:
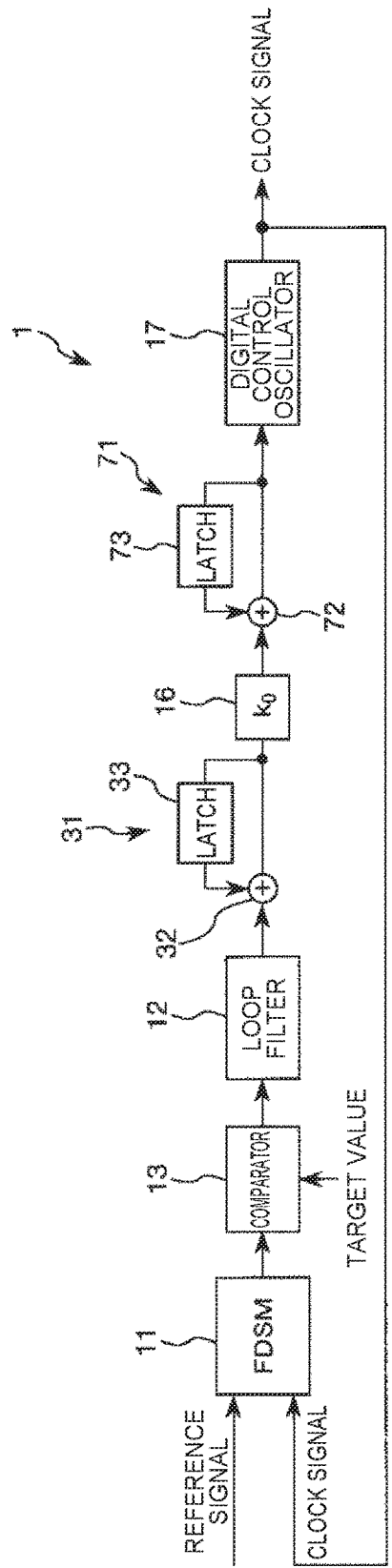
FIG. 7 is a block diagram illustrating a fourth embodiment of the frequency synthesizer according to the invention.

FIG. 7 is a block diagram illustrating a fourth embodiment of the frequency synthesizer according to the invention.

Hereinafter, the fourth embodiment will be described centering on different points between the above-mentioned second and third embodiments and the fourth embodiment, and the same points therebetween will not be described.

As shown in FIG. 7, the frequency synthesizer 1 of the fourth embodiment has the FDSM 11, the comparator 13, the loop filter 12, the integrating section 31, the gain section 16 in which the gain is set as $k_0$, the integrating section 71, and the digital control oscillator 17. The FDSM 11, the comparator 13, the loop filter 12, the integrating section 31, the gain section 16, the integrating section 71, the digital control oscillator 17 are connected to the output side in this order.

The comparator 13 is the same as the comparator 13 according to the third embodiment. The comparator 13 is configured to perform signal processing through signed binary representation.

According to the above-mentioned fourth embodiment, the same effect as those of the above-mentioned second and third embodiments can also be exhibited.

Fifth Embodiment

Figure 8:
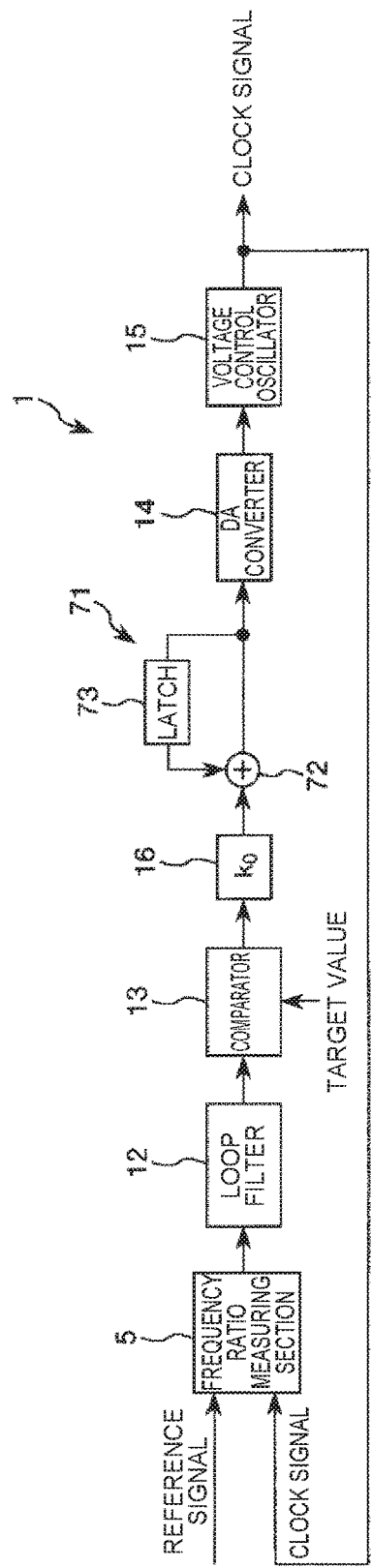
FIG. 8 is a block diagram illustrating a fifth embodiment of the frequency synthesizer according to the invention.
Figure 9:
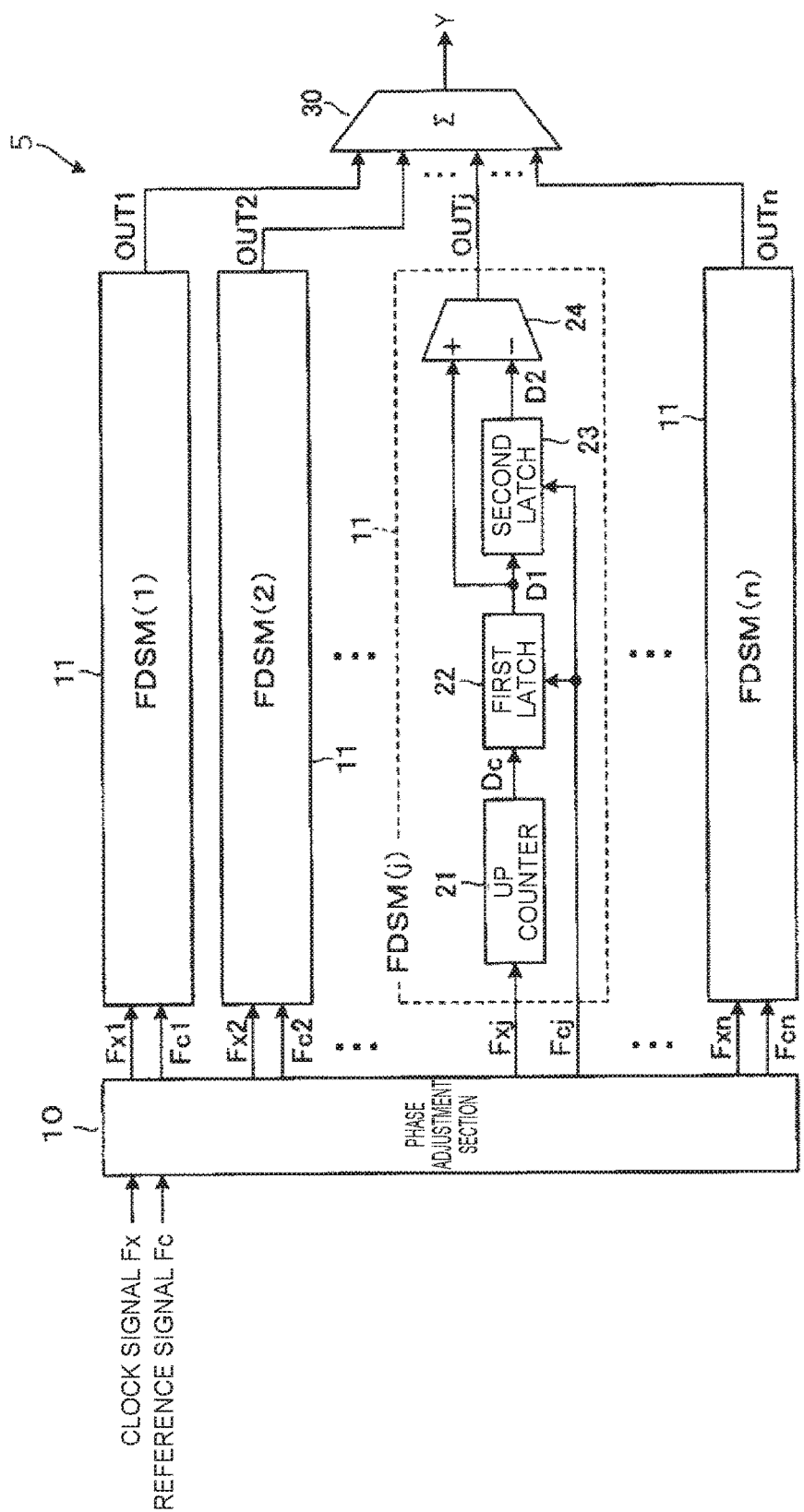
FIG. 9 is a block diagram illustrating a frequency ratio measuring section of the frequency synthesizer shown in FIG. 8.

FIG. 8 is a block diagram illustrating a fifth embodiment of the frequency synthesizer according to the invention. FIG. 9 is a block diagram illustrating a frequency ratio measuring section of the frequency synthesizer shown in FIG. 8.

Hereinafter, the fifth embodiment will be described centering on different points between the above-mentioned first embodiment and the fifth embodiment, and the same points therebetween will not be described.

As shown in FIG. 8, the frequency synthesizer 1 of the fifth embodiment has the frequency ratio measuring section 5, the loop filter 12, the comparator 13, the gain section 16, the integrating section 71, the DA converter 14, and the voltage control oscillator 15. The frequency ratio measuring section 5, the loop filter 12, the comparator 13, the gain section 16, the integrating section 71, the DA converter 14, and the voltage control oscillator 15 are connected to the output side in this order.

As shown in FIG. 9, the frequency ratio measuring section 5 has the phase adjustment section 10, a plurality of frequency delta sigma modulators (FDSMs) 11 connected in parallel (parallelized), and the adder 30. The phase adjustment section 10, the FDSMs 11, and the adder 30 are connected to the output side in this order. Each FDSM 11 is the FDSM having the data stream configuration, and as the FDSM 11, it is possible to use the FDSM described in the first embodiment.

Hereinafter, the frequency ratio measuring section 5 will be described in detail.

1-1: Overall Configuration

FIG. 9 is a block diagram illustrating the frequency ratio measuring section 5 according to the fifth embodiment. As shown in the drawing, the frequency ratio measuring section 5 adjusts a phase of at least one of the clock signal Fx or the reference signal Fc, and includes the phase adjustment section 10 that outputs output clock signals Fx1 to Fxn and output reference signals Fc1 to Fcn having n (n is a natural number of 2 or more) groups, and n FDSMs (1) to (n) which are connected in parallel, and the adder 30.

The j-th (j is an arbitrary natural number equal to or greater than 1 and equal to or less than n) FDSM (j) performs frequency delta sigma modulation on an output clock signal Fxj by using an output reference signal Fcj, and generates output data OUTj. The adder 30 adds up output data OUT1 to OUTn, and generates a frequency delta sigma modulation signal Y.

The FDSM (j) includes: the up counter 21 that outputs the count data Dc which indicates a count value by counting up the rising edges of the output clock signal Fxj; the first latch 22 that latches the count data Dc in synchronization with the rising edges of the output reference signal Fcj and outputs the first data D1; the second latch 23 that latches the first data D1 in synchronization with the rising edges of the output reference signal Fcj and outputs the second data D2; and the subtractor 24 that subtracts the second data D2 from the first data D1 and generates the output data OUTj. The first latch 22 and the second latch 23 are formed as, for example, D flip-flop circuits or the like. In addition, the FDSMs (1) to (j−1) and the FDSMs (j+1) to (n) are formed in a manner similar to that of the FDSM (j).

This exemplary FDSM (j) is called a primary frequency delta sigma modulator, latches a count value of the output clock signal Fxj twice on the basis of the output reference signal Fcj, and sequentially holds count values of the output clock signal Fxj when the rising edges of the output reference signal Fcj are set as triggers. In this example, it is assumed that the latch operation is performed at the rising edge. However, the latch operation may be performed at a falling edge. Further, the subtractor 24 calculates a difference between the held two count values, and outputs an increment in the count value of the output clock signal Fxj, which is observed over time during transition of the output reference signal Fcj for a single period, without a dead period in accordance with the passage of time. Assuming that a frequency of the output clock signal Fx is fx and a frequency of the output reference signal Fc is fc, a frequency ratio is represented by fx/fc. The FDSM (j) outputs the frequency ratio as a digital signal sequence. The output data OUTj, which is output from the FDSM (j), includes a quantization error.

1-2: Relationship Between Frequency Delta Sigma Modulation and Idle Tone

Next, a relationship between the frequency delta sigma modulation and the idle tone will be described. As the clock signal Fx, a signal (47.619047 kHz) of a single period of 21 μS is considered. Further, as the reference signal Fc, a signal (15.15 kHz) of a single period of 66 μS is considered. This corresponds to a case where the frequency fx of the clock signal Fx is higher than the frequency fc of the reference signal Fc. The ratio of fx and fc is given as the following expression.

$$fx{:}fc = 1/21e^{-6} {:} 1/66e^{-6} = 22{:}7$$

In this case, the time of 22 periods of the clock signal Fx is the same as the time of 7 periods of the reference signal Fc. That is, the same data sequence is repeated for each time period of 21 μS×22=66 μS×7=462 μS.

Figure 10:
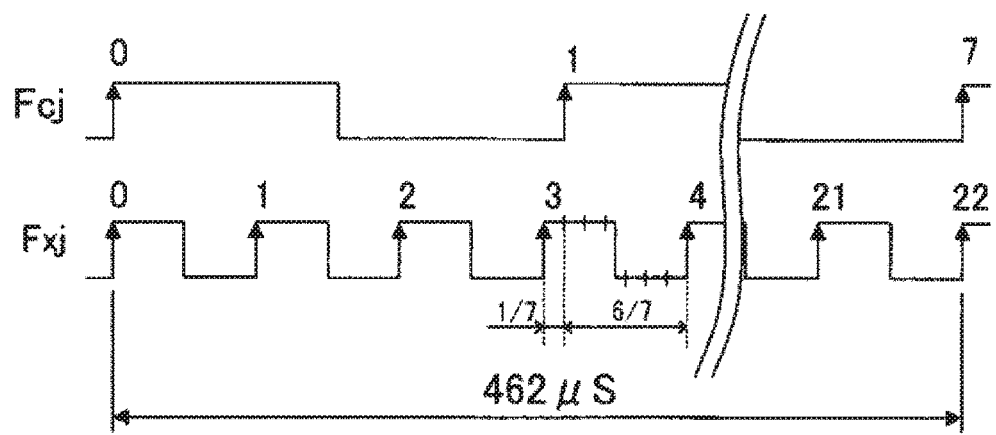
FIG. 10 is a timing chart illustrating examples of an output reference signal and an output clock signal.

The operation of the FDSM (j) at this time is as follows. While the output reference signal Fcj advances by a single period, the output clock signal Fxj advances by 22/7 periods=3+1/7 periods, and the count value increases by 3 or 4. Accordingly, 3 or 4 is output from the subtractor 24 in accordance with the passage of time. FIG. 10 shows such a relationship in which an origination is set in a case where the rising edges of the output reference signal Fcj and the output clock signal Fxj coincide with each other. FIG. 10 also shows a situation where the rising edges coincide with each other again after 462 μS from the moment at which the rising edges of the output reference signal Fcj and the output clock signal Fxj coincide with each other. Generally, even in a case where the origination is set when the rising edges of the output reference signal Fcj and the output clock signal Fxj do not coincide with each other, there is no change in repetition of pulse strings corresponding to deviation of the phases for the period of 462 μS. Here, for the sake of simplicity, it is assumed that the origination is set at the moment at which the rising edges of the output reference signal Fcj and the output clock signal Fxj coincide with each other.

Figure 11:
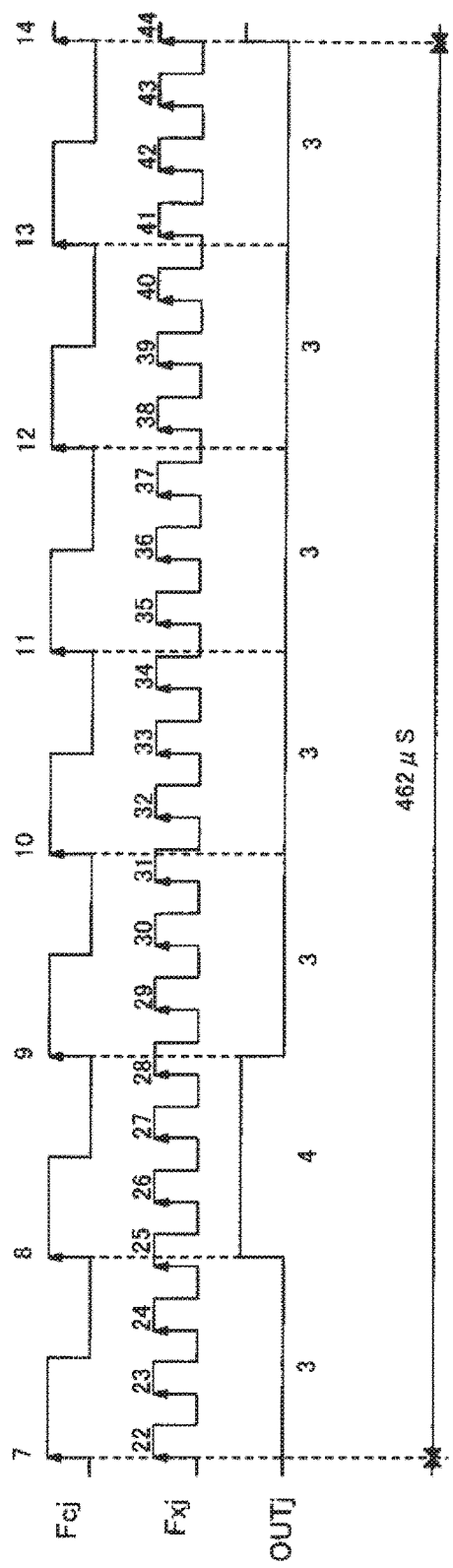
FIG. 11 is a timing chart illustrating an example of output data.

In a data sequence of the output data OUTj of actual FDSM (j), a repeated pattern of "3433333" as shown in FIG. 11 appears at the period of 462 μS. In addition, in the FDSM (j) of FIG. 9, the outputs of the first latch 22 and the second latch 23 at the time of initiating the operation are not determined, and FIG. 11 shows a repeated pattern of the second circulation subsequent to the first circulation of the period of 462 μS. It is easily understood that the repeated pattern at the period of 462 μS means advancement of the period of the output clock signal Fxj shown in FIG. 12. In a case of this example, it is indicated that the output clock signal Fxj advances by 3+1/7 periods while the output reference signal Fcj advances for an initial single period, and when focusing on a 4-th period of the output clock signal Fxj, the output clock signal Fxj advances by 1/7 periods based on an end of a 3-rd period of the output clock signal Fxj. Such a non-integer appears because a value of a frequency ratio or a period ratio between the output clock signal Fxj and the output reference signal Fcj is not in an integer relationship, and thus a point at which the output clock signal Fxj advances from the end of the 3-rd period of the output clock signal Fxj by 1/7 periods is set as an origination of the phase of the output clock signal Fxj at a 2-nd period of the output reference signal Fcj. Then, in an end of the 2-nd period of the output reference signal Fcj, the output clock signal Fxj advances by 6+2/7 periods counted from the initial. In consideration of this, it is indicated that a non-integer of the number times of transition returns to 0 (a non-integer corresponding to the phase shift when a case where the rising edge of the output clock signal Fxj does not coincide with the rising edge of the output reference signal Fcj is set as an origination) whenever the output reference signal Fcj advances by 7 periods. Regardless of the level of the output clock signal Fxj, noise caused by a frequency component of such a repeated pattern having periodic properties is the idle tone.

The idle tone is generated inside FDSM (j) by the quantization error on the basis of a phase relationship between the output reference signal Fcj and the output clock signal Fxj. In a case where the idle tone is not generated, a change in the output data OUTj of the FDSM (j) indicates fluctuation or variation in the output clock signal Fxj with respect to the output reference signal Fcj. Therefore, when an effect of the idle tone is ignored, the output data OUTj in a case where there is no fluctuation or variation in the output clock signal Fxj with respect to the output reference signal Fcj can be regarded as a direct current. In other words, the effect of the idle tone which overlaps with the variation in the output clock signal Fxj with respect to the output reference signal Fcj appears in the change in the output data OUTj. The idle tone can be eliminated or reduced by performing filtering on the output data OUTj of the FDSM (j).

However, in a case where a performance of a filter has a limitation and the frequency fx of the output clock signal Fxj or a variation therein is unknown, a problem arises in that it is difficult to determine a specification of the filter. Further, detection of a fluctuation component or a variation component of the output clock signal Fxj with respect to the output reference signal Fcj in a blocking region of the filter is also blocked. Accordingly, in high accuracy measurement using FDSM, it is important to suppress the idle tone itself.

Figures 12, 13:
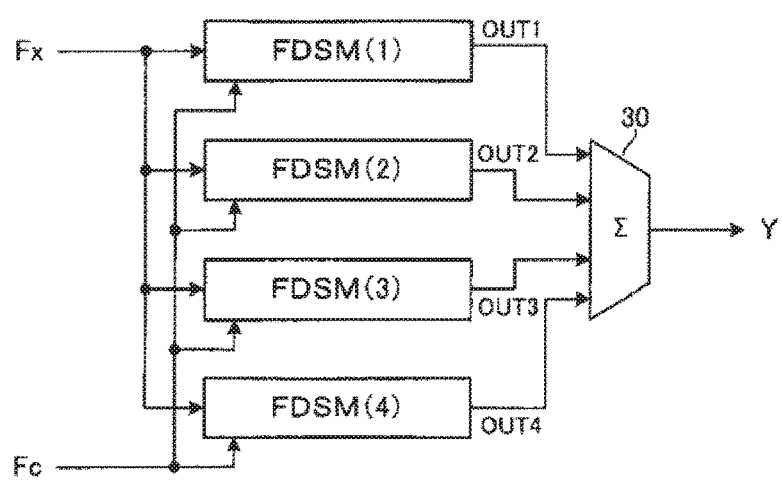
FIG. 12 is an explanatory diagram illustrating progress in a period of the output clock signal.
FIG. 13 is a block diagram of a device in which the FDSMs are simply connected in parallel.

Next, the idle tone in the case where the FDSMs are connected in parallel will be discussed. FIG. 13 is an example in which four FDSMs (1) to (4) are simply parallelized and the output data OUT1 to OUT4 are added up. In the device, the phase adjustment section 10 is removed from the frequency ratio measuring section 5 shown in FIG. 9, and the clock signal Fx and the reference signal Fc are directly supplied to the four FDSMs (1) to (4).

Figure 14:
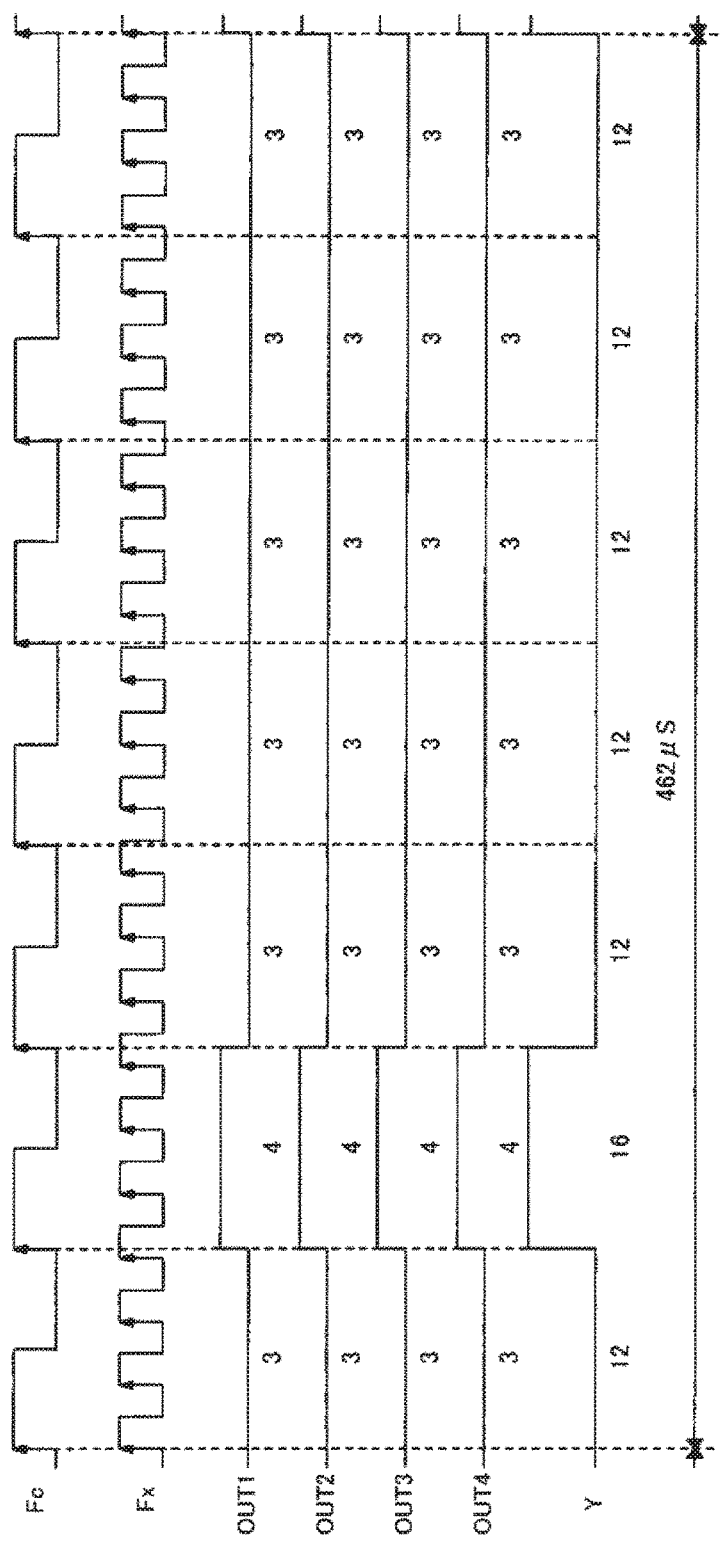
FIG. 14 is a timing chart of the device shown in FIG. 13.

Here, in a case where the clock signal Fx coincides with the output clock signal Fxj shown in FIG. 10, and the reference signal Fc coincides with the output reference signal Fcj shown in FIG. 10, a timing chart of the device shown in FIG. 13 is shown in FIG. 14. Comparing FIG. 14 with FIG. 11, it can be seen that even when the four FDSMs (1) to (4) are parallelized, the repeated pattern of "3433333" of the single FDSM (j) shown in FIG. 11 is merely changed to "12 16 12 12 12 12 12". That is, an intensity of the frequency delta sigma modulation signal Y is quadrupled, but a quantization error is also quadrupled, and thus an SN ratio (signal-to-noise ratio) of "3433333" coincides with an SN ratio of "12 16 12 12 12 12 12". In other words, it is indicated that there is no change in the effect of the idle tone generated only by simply connecting the FDSMs in parallel. As can be clearly seen from FIG. 14, the reason for this is because phase relationships of the idle tones between the outputs of the FDSMs (1) to (4) coincide with each other. Accordingly, not only in the four parallelized FDSMs but also in 5, 6, 7, ..., and n parallelized FDSMs, the effect of the idle tone is not changed.

It is clear the phase of the idle tone is determined by the phase relationship between two signals which are input into the FDSM. Further, in order to disperse the phases of the idle tones between the outputs of the n parallelized FDSMs, a relative position of a repeated pattern appearing in the output of each single FDSM constituting the n parallelized FDSMs may be shifted. For this reason, it is necessary to disperse a relative phase between parallel inputs of the output clock signal and the output reference signal which are input into each FDSM.

1-3: Phase Adjustment Section

In the present embodiment, the phase adjustment section 10 generates n groups of output clock signals and output reference signals (Fx1, Fc1), (Fx2, Fc2), ..., and (Fxn, Fcn) by relatively adjusting the phase between the clock signal Fx and the reference signal Fc such that all the phases of the idle tones of the output data OUT1 to OUTn are different.

Figure 15A:
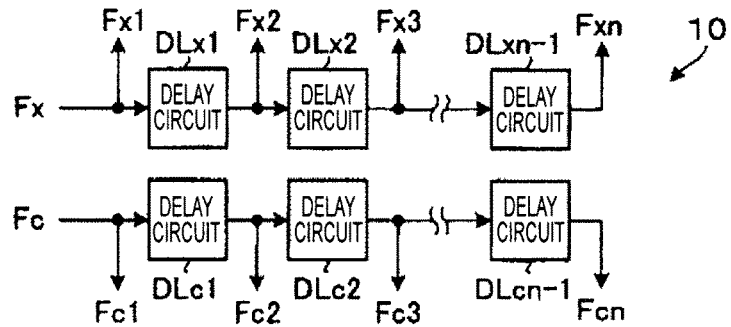
FIG. 15A is a block diagram illustrating an example of a phase adjustment section.
Figure 15B:
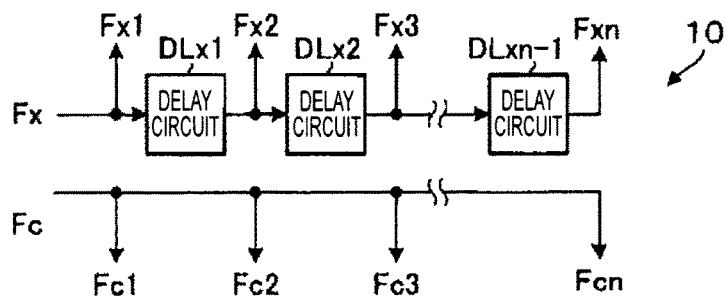
FIG. 15B is a block diagram illustrating an example of the phase adjustment section.
Figure 15C:
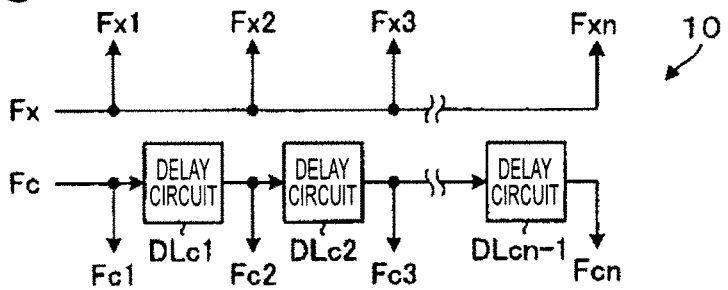
FIG. 15C is a block diagram illustrating an example of the phase adjustment section.
Figure 15D:
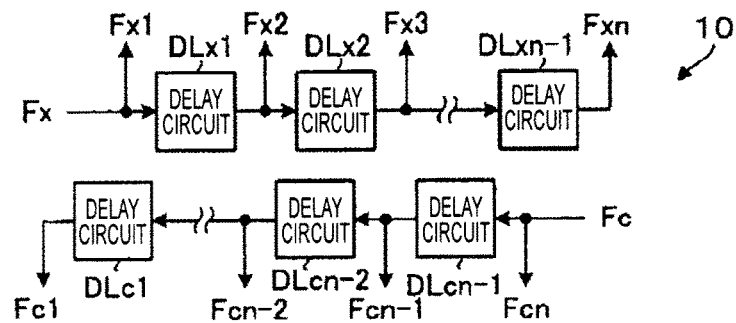
FIG. 15D is a block diagram illustrating an example of the phase adjustment section.

Here, as shown in FIG. 15A, the phase adjustment section 10 sequentially delays the clock signal Fx by delay circuits DLx1 to DLxn−1 and generates output clock signals Fx1 to Fxn, and sequentially delays the reference signal Fc through delay circuits DLc1 to DLcn−1 and generates the output reference signals Fc1 to Fcn. Alternatively, as shown in FIG. 15B, the phase adjustment section 10 may sequentially delay the clock signal Fx by the delay circuits DLx1 to DLxn−1 and may generate the output clock signals Fx1 to Fxn, and may generate the output reference signals Fc1 to Fcn without delaying the reference signal Fc. Further, as shown in FIG. 15C, the phase adjustment section 10 may generate the output clock signals Fx1 to Fxn without delaying the clock signal Fx, and may sequentially delay the reference signal Fc by the delay circuits DLc1 to DLcn−1 and may generate the output reference signals Fc1 to Fcn. Furthermore, as shown in FIG. 15D, the phase adjustment section 10 may be configured to set a maximum phase difference by wiring and inputting the clock signal Fx and the reference signal Fc such that an increasing order of an amount of each delay of the clock signal Fx and the reference signal Fc is different. Each delay circuit is not particularly limited, but it is possible to use, for example, an inverter or the like.

1-4: Method of Determining Amount of Delay and Delaying Signal

Next, a method of determining an amount of delay and delaying a signal will be described. As described above, the output data OUTj, which is obtained when each of the output clock signal Fxj and the output reference signal Fcj is input into the FDSM (j), is a periodic data sequence which is determined by a ratio of the frequency fx of the clock signal Fx and the frequency fc of the reference signal Fc. If the output clock signal Fxj which is obtained by delaying the clock signal Fx and the reference signal Fc are input into the FDSM (j), a period of the data sequence and a repeated pattern appearing in the data sequence are not changed compared to a case where the clock signal Fx is input without being delayed, but an initial position of the repeated pattern is shifted. Comparing the initial positions of the repeated pattern of the output obtained before and after being delayed, the initial position of the repeated pattern is changed stepwise in accordance with an increase in the amount of delay of the clock signal Fx. In addition, when the amount of delay of the clock signal Fx is equal to Ka periods (Ka is a natural number) of the clock signal Fx, a relative phase relationship between the output clock signal Fxj and the reference signal Fc coincides with that before being delayed (a relative phase relationship between the clock signal Fx and the reference signal Fc) (a condition A).

Likewise, even in a case where the clock signal Fx is input into the FDSM (j) without being delayed and the output reference signal Fcj which is obtained by delaying the reference signal Fc is input into the FDSM (j), a repeated pattern and a period of the output data OUTj are not changed compared to a case where the reference signal Fc is input without being delayed, but an initial position of the repeated pattern is shifted. Comparing initial positions of the repeated pattern of the output obtained before and after being delayed, the initial position of the repeated pattern is changed stepwise in accordance with an increase in the amount of delay of the reference signal Fc. When the amount of delay of the reference signal Fc is equal to Kb periods (Kb is a natural number) of the reference signal Fc, a relative phase relationship between the clock signal Fx and the output reference signal Fcj coincides with that before being delayed (a relative phase relationship between the clock signal Fx and the reference signal Fc) (a condition B).

Here, in the amount of delay satisfying either the condition A or the condition B, a minimum amount of delay τ coincides with the shorter period of a single period of the clock signal Fx and a single period of the reference signal Fc, and a relative phase relationship, which is obtained when the amount of delay of the clock signal Fx or the reference signal Fc is increased by τ, coincides with a state before being delayed. If the amount of delay satisfies either the condition A or the condition B, the initial position of the repeated pattern of the output data OUTj coincides with that of a case of not being delayed. In order to disperse the idle tone, it is necessary to shift the initial position of the repeated pattern.

Therefore, a signal having a higher frequency of the frequencies of the clock signal Fx and the reference signal Fc is delayed and parallelized such that an amount of delay T coinciding with a single period of the signal is divided into n. Thus, it is possible to disperse a relative phase between the parallel inputs of the clock signal Fx and the reference signal Fc. According to this, the initial position of the repeated pattern is shifted, and thereby the phases of the idle tones between the output data OUT1 to OUTn of n parallelized FDSMs (1) to (n) are dispersed.

Next, a description will be given of a case where an amount of delay at which the relative phase relationship coincides with the relative phase relationship between the clock signal Fx and the reference signal Fc is set as T. In this case, the same effect is obtained in that the relative phases of the idle tones between the output data OUT1 to OUTn of n parallelized FDSMs (1) to (n) are dispersed even when the clock signal Fx is delayed and parallelized such that T is divided into n or even when the reference signal Fc is delayed and parallelized such that T is divided into n without delaying the clock signal Fx.

Even when comparing a case where a signal which is obtained by delaying the reference signal Fc by δ is input into the FDSM (j) with a case where a signal which is obtained by preceding the clock signal Fx by δ without delaying the reference signal Fc is input into the FDSM (j), the relative phase relationship between the output clock signal Fxj and the output reference signal Fcj is not changed. Therefore, though it is considered that the output clock signal Fxj which is obtained by preceding the clock signal Fx by δ without delaying the reference signal Fc is input into the FDSM (j) instead of inputting the output reference signal Fcj which is obtained by delaying the reference signal Fc by δ into FDSM (j), there is no difficulty in describing the data sequence of the output data OUTj.

On the other hand, an amount of precedence, at which the relative phase relationship coincide with the relative phase relationship between the output clock signal Fxj and the output reference signal Fcj, is equal to the amount of delay T. Thus, it can be said that, if the amount of delay or the amount of precedence is set as a variable number, the relative phase relationship between the output clock signal Fxj and the output reference signal Fcj has a period T.

Here, even when the output clock signals Fx1 to Fxn which are preceded and parallelized such that the amount of precedence T is divided into n are input into the FDSMs (1) to (n) or even when the output clock signals Fx1 to Fxn which are delayed and parallelized such that the amount of delay T is divided into n are input into the FDSMs (1) to (n), there is no change in that the relative phase between the output clock signal and the output reference signal is dispersed within the period T at which the relative phase relationships coincide with each other.

Therefore, even when any one of "the reference signal Fc is delayed such that T is divided into n"→"the clock signal Fx is preceded such that T is divided into n"→"the clock signal Fx is delayed such that T is divided into n" is considered, it can be seen that there is no change in that the relative phase is dispersed. This is established even when the clock signal Fx and the reference signal Fc are replaced with each other.

As described above, even when the clock signal Fx is delayed and parallelized such that T is divided into n or the reference signal Fc is delayed and parallelized such that T is divided into n without delaying the clock signal Fx, it can be said that the same effect is obtained in that the relative phases of the idle tones between the output data OUT1 to OUTn of n parallelized FDSMs (1) to (n) are dispersed.

Here, as the amount of delay T at which the relative phase relationship coincides with the relative phase relationship between the output clock signal Fxj and the output reference signal Fcj, an amount of delay can be selected to coincide with either the Ka period of the clock signal Fx (Ka is a natural number) or the Kb period of the reference signal Fc (Kb is a natural number). However, when a large amount of delay (Ka is greater than or equal to 2 or Kb is greater than or equal to 2) is set, a bias may occur in a dispersion of the phase of the idle tone, and thus caution therefor is necessary. Further, a general condition in which a bias does not occur in the dispersion of the phase of the idle tone will be described later.

It is preferable that a minimum amount of delay among the amount of delay at which the relative phase relationship coincides with the relative phase relationship between the output clock signal Fxj and the output reference signal Fcj is selected as T such that periodic properties smaller than T may not be considered. That is, the amount of delay T may be determined to be equal to a single period of a signal having a higher frequency between the frequency fx of the clock signal Fx and the frequency fc of the reference signal Fc, and the signal may be delayed and parallelized such that the single period is divided into n. As shown in an example of FIG. 17, in a case where the frequency fx is higher than the frequency fc, the amount of delay is set such that the single period of the clock signal Fx is divided into n, and the clock signal Fx or the reference signal Fc is delayed and parallelized. Thus, the relative phases of the idle tones between the output data OUT1 to OUTn are dispersed, and a cancelling effect can be used in the sum of the output data OUT1 to OUTn. The amounts of delay, which are equal to each other and of which a maximum value can be ensured at a minimum phase difference between the delay signals, are quite appropriate, and at this time, a maximum dispersion effect is obtained.

Figure 16:
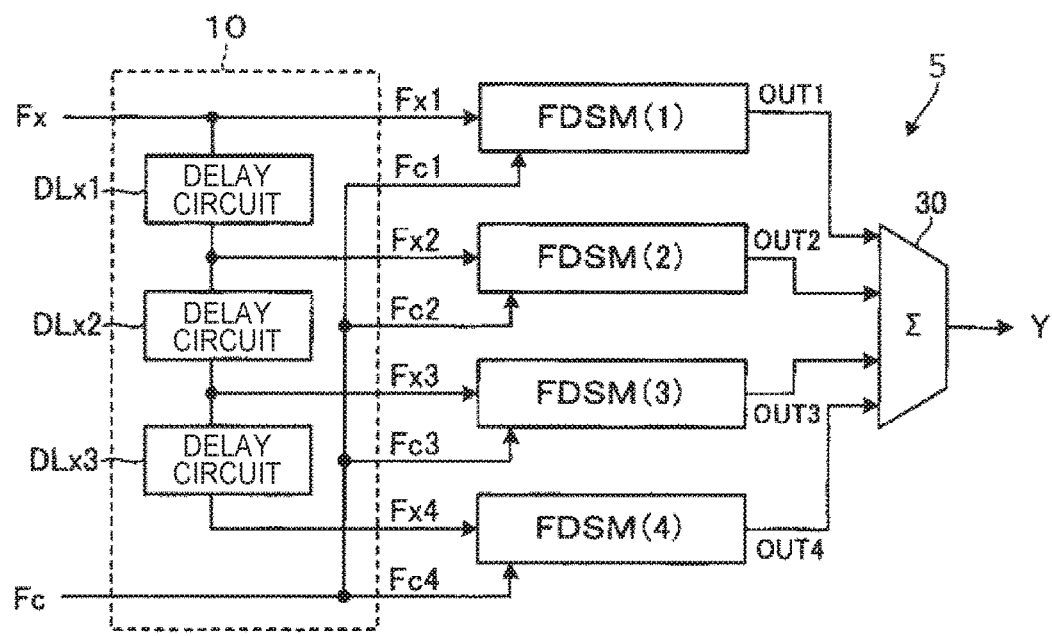
FIG. 16 is a block diagram illustrating a configuration example of the frequency ratio measuring section in a case where a frequency of a clock signal is higher than a frequency of a reference signal.
Figure 17:
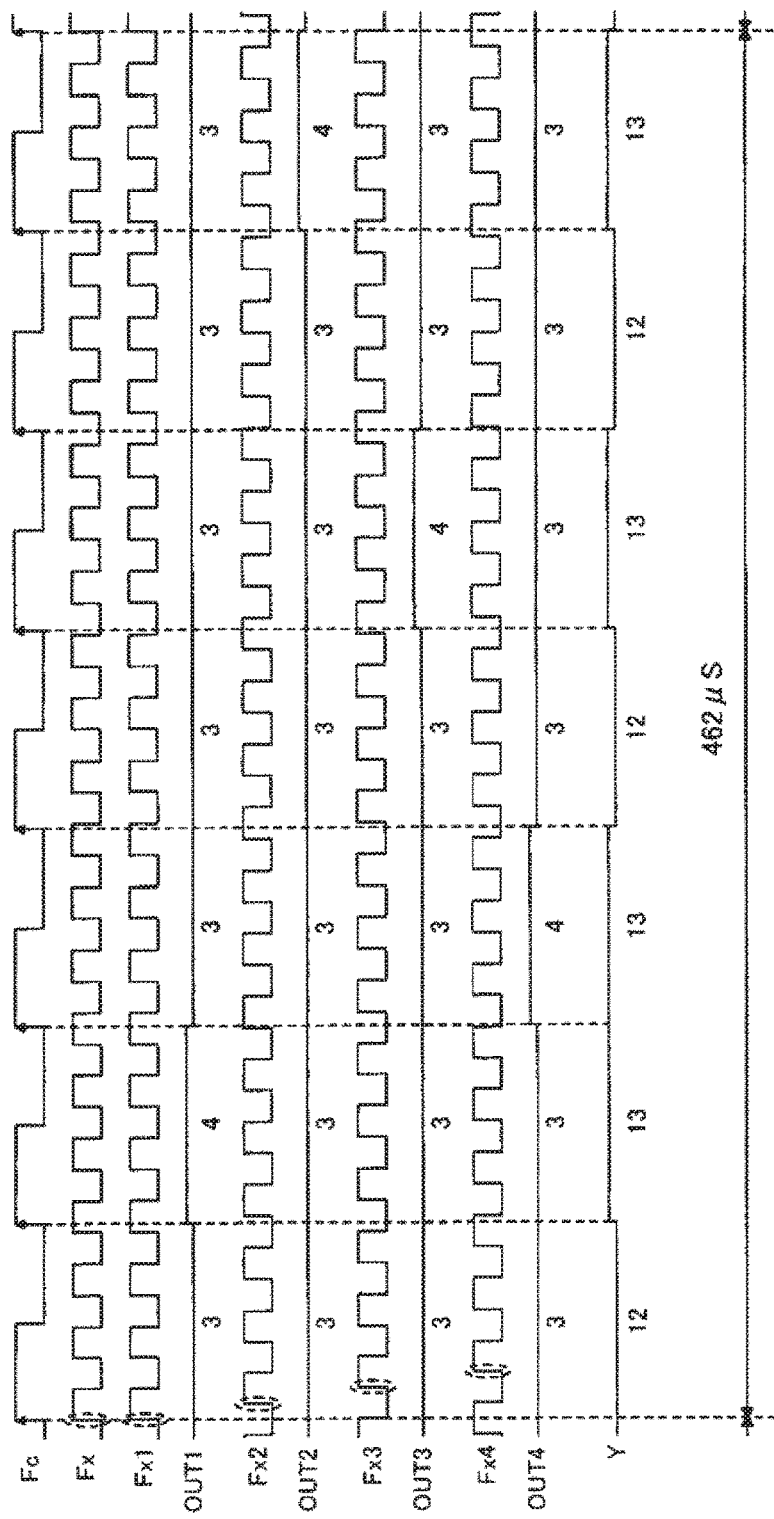
FIG. 17 is a timing chart of the frequency ratio measuring section shown in FIG. 16.

1-4-1: Case where Frequency Fx of Clock Signal Fx is Higher than Frequency Fc of Reference Signal Fc In the output clock signal Fxj and the output reference signal Fcj shown in FIG. 10, the minimum amount of delay, at which the relative phase relationships coincide with each other, is 21 μS which is equal to the single period of the clock signal Fx from fx>fc. In a case where n is 4, the frequency ratio measuring section 5 can be configured as shown in FIG. 16. Here, an amount of delay of the delay circuits DLx1 to DLx3 is 21/4 μS. A timing chart of the frequency ratio measuring section 5 shown in FIG. 16 is shown in FIG. 17. As shown in the same drawing, a pattern of the output data OUT1 to OUT4 is dispersed, and thus the idle tone is dispersed in the frequency delta sigma modulation signal Y.

Figure 18:
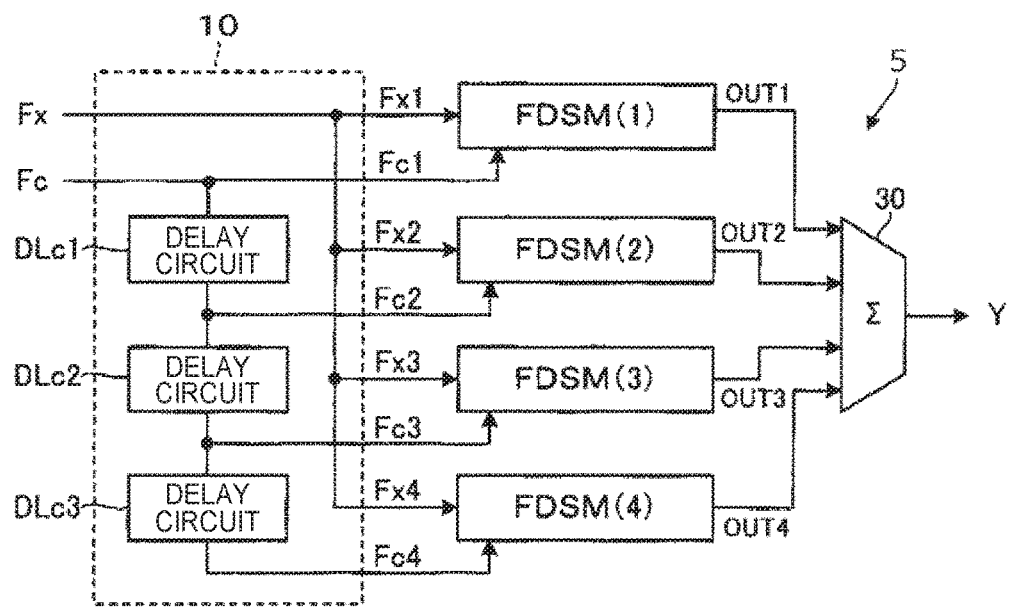
FIG. 18 is a block diagram illustrating a configuration example of the frequency ratio measuring section in a case where the frequency of the reference signal is higher than the frequency of the clock signal.

1-4-2: Case where Frequency Fc of Reference Signal Fc is Higher than Frequency Fx of Clock Signal Fx Next, a case where the frequency fc of the reference signal Fc is higher than the frequency fx of the clock signal Fx will be described. In a case where n is 4, the frequency ratio measuring section 5 can be configured as shown in FIG. 18.

Figure 19:
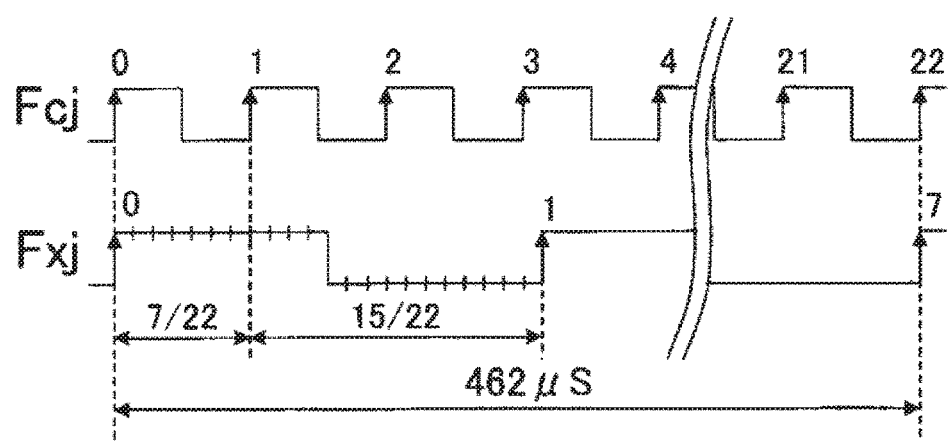
FIG. 19 is a timing chart illustrating examples of the output reference signal and the output clock signal.

In the operation of the FDSM (j) (j is a natural number of n or less), a signal (15.15 kHz) at a single period of 66 μS is considered as the clock signal Fx, and a signal (47.619047 kHz) at a single period of 21 μS is considered as the reference signal Fc instead of the frequency relationship in an example of FIG. 10. A frequency ratio [fx:fc] of the clock signal Fx and the reference signal Fc is given by the following expression.

fx:fc=1/66e$^{-6}$:1/21e$^{-6}$=7:22 is obtained. Thus, a time of 7 periods of the clock signal Fx is equal to a time of 22 periods of the reference signal Fc, and thus it is found that the same data sequence is repeated for each time period of 66 μS×7=21 μS×22=462 μS. As the operation of the FDSM (j), as shown in FIG. 19, if the moment at which the rising edges of the output reference signal Fcj and the output clock signal Fxj coincide with each other is set as an origination, the output clock signal Fxj advances by 7/22 periods while the output reference signal Fcj advances for a single period, and the count data Dc is increased by 0 or 1.

Figure 20:
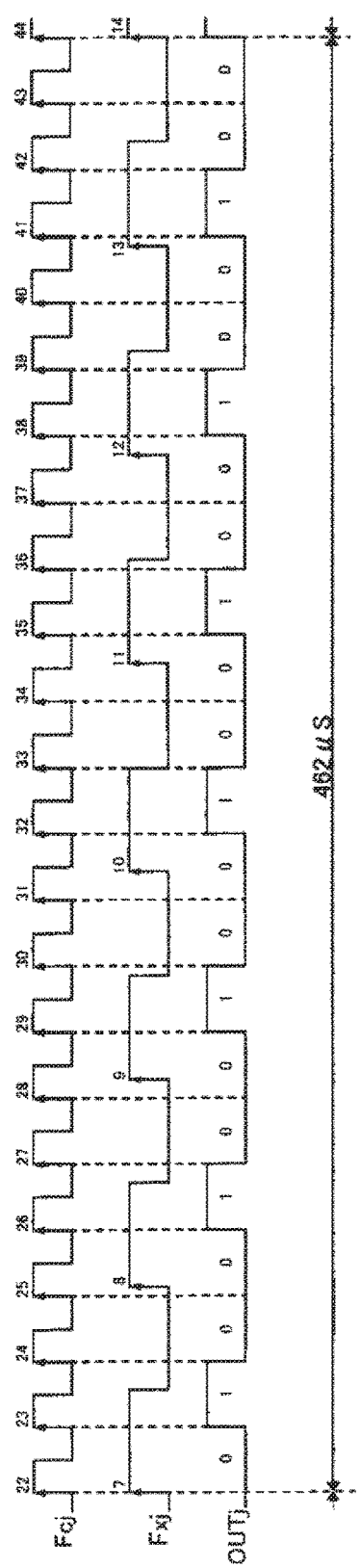
FIG. 20 is a timing chart illustrating an example of output data of an FDSM.

In this case, as shown in FIG. 20, in the output data OUTj of the FDSM (j), a data sequence of a period of 462 μS "0100100100100100100100" appears. Further, in FDSM (j) shown in FIG. 20, the outputs of the first latch 22 and the second latch 23 at the time of initiating the operation are not determined. Thus, a data sequence of the second circulation subsequent to the first circulation of the data sequence of 462 μS is shown.

Figure 21:
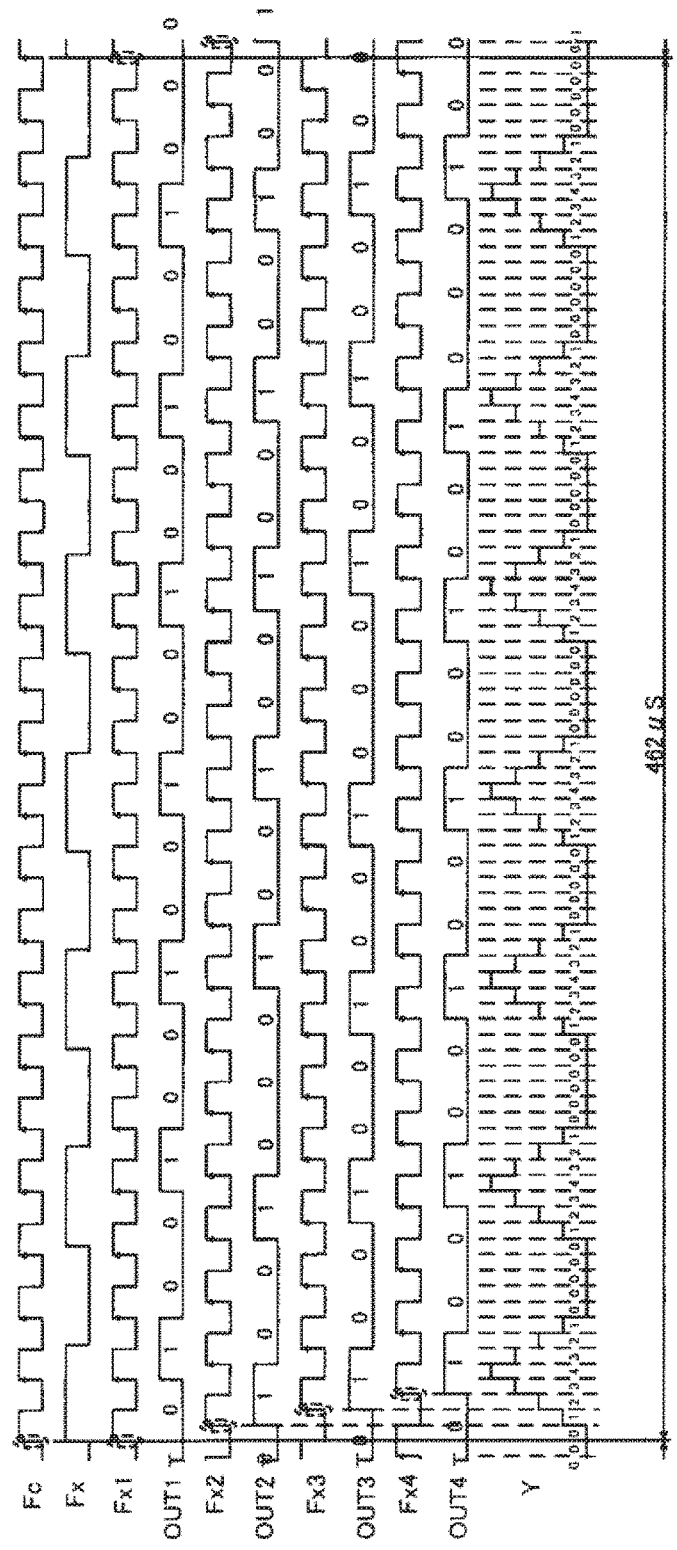
FIG. 21 is a timing chart of the frequency ratio measuring section shown in FIG. 18.
Figure 22:
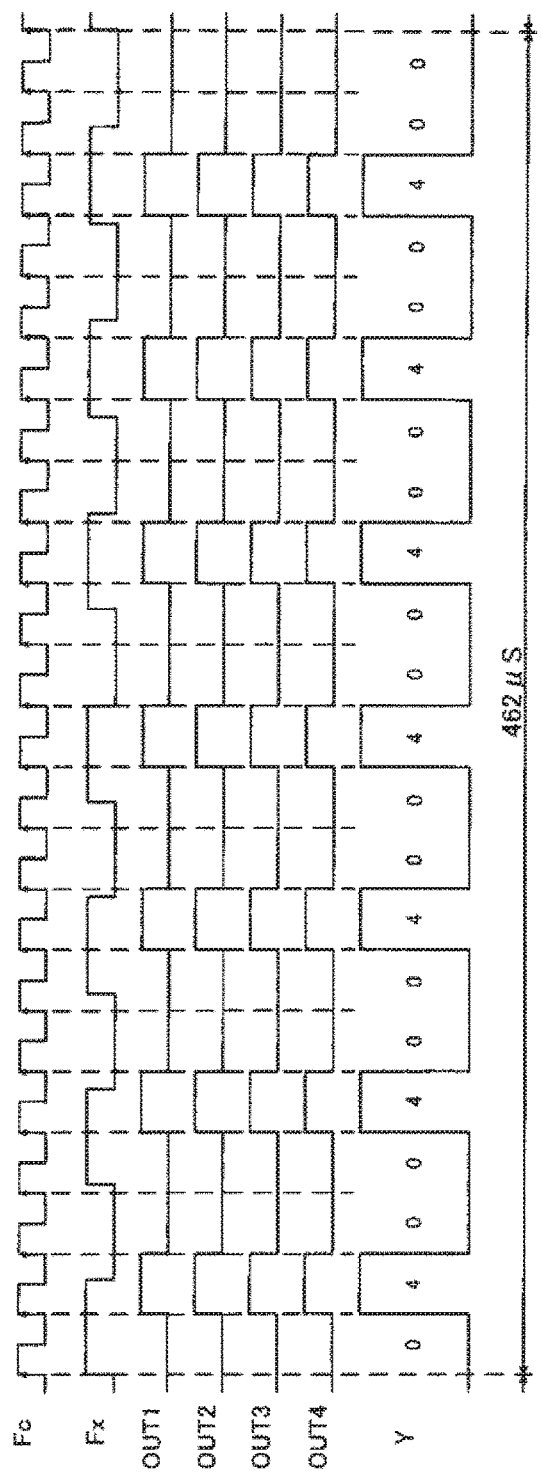
FIG. 22 is a timing chart of the device shown in FIG. 13 in which the phase adjustment section is deleted from the frequency ratio measuring section shown in FIG. 18.

The single period of the reference signal Fc of which the frequency is higher than that of the clock signal Fx is 21 μS, and thus the amount of delay of the delay circuits DLc1 to DLc3 shown in FIG. 18 is 21/4 μS. A timing chart of the frequency ratio measuring section 5 shown in FIG. 18 is shown in FIG. 21. As shown in the same drawing, the pattern of the output data OUT1 to OUT4 is dispersed, and thus the idle tone is dispersed in the frequency delta sigma modulation signal Y. In contrast, a timing chart of the device shown in FIG. 13 in which the phase adjustment section 10 is eliminated from the frequency ratio measuring section 5 shown in FIG. 18 is shown in FIG. 22. In this case, the idle tone is not dispersed, and thus it is difficult to improve the SN ratio. Here, compared with the case of using the FDSM as the frequency ratio measuring section 5, the idle tone is reduced, and the SN ratio is improved.

In the frequency ratio measuring section 5 of the fifth embodiment, FDSMs (1) to (n) generate the output data OUT1 to OUTn in a data stream format. In addition, as described above, assuming that the shorter period of the single period of the clock signal Fx and the single period of the reference signal Fc is Tx, the phase adjustment section 10 sequentially delays one of the clock signal Fx and the reference signal Fc by Tx/n, and generates the output clock signals Fx1 to Fxn and the output reference signals Fc1 to Fcn.

Here, the period of the idle tone is determined according to the single period of the clock signal Fx and the single period of the reference signal Fc, but is not below Tx. On the other hand, the phase of the idle tone, which overlaps with each of the output data OUT1 to OUTn, is determined according to the phases of the n groups of output clock signals and output reference signals (Fx1, Fc1), (Fx2, Fc2), . . . , and (Fxn, Fcn) supplied to FDSMs (1) to (n). As described above, if one of the clock signal Fx and the reference signal Fc is sequentially delayed by Tx/n, the phase of the idle tone, which overlaps with each of the output data OUT1 to OUTn, can be shifted by Tx/n. As a result, the phase of the idle tone, which overlaps with each of the output data OUT1 to OUTn, can be dispersed.

As described with reference to FIGS. 15A to 15D, the method of delaying has various aspects. The phase of the idle tone is determined according to the phase of the output clock signal and the output reference signal supplied to FDSM. Therefore, the n groups of output clock signals and output reference signals (Fx1, Fc1), (Fx2, Fc2), . . . , and (Fxn, Fcn) may be generated by relatively adjusting the phase between the clock signal Fx and the reference signal Fc such that the phase of the idle tone which overlaps with the output data OUT1 to OUTn is shifted by Tx/n.

Specifically, when the phase difference between the output clock signal Fxi and the output reference signal Fci supplied to i-th (i is an arbitrary natural number of n−1 or less) FDSM (i) is Pi, the phase adjustment section 10 may generate the n groups of output clock signals and output reference signals (Fx1, Fc1), (Fx2, Fc2), . . . , and (Fxn, Fcn) by relatively adjusting the phase between the clock signal Fx and the reference signal Fc such that Tx/n=Pi+1−Pi.

In the frequency ratio measuring section 5 according to the fifth embodiment, even when the clock signal Fx and the reference signal Fc are interchanged, the effect of dispersing the phase of the idle tone corresponding to each of n parallelized FDSMs (1) to (n) is not degraded only by changing a counting signal and a counted signal. Thus, it is not necessary to change the configuration (for example, when a usual count configuration of the frequency measurement device is used as a reciprocal configuration, or the like).

Next, operations of the frequency synthesizer 1 will be described.

As shown in FIG. 8, the reference signal and the clock signal, which is output from the digital control oscillator 17, are input to the frequency ratio measuring section 5 of the frequency synthesizer 1, and the frequency ratio measuring section 5 performs the above-mentioned predetermined processing.

A signal indicating the frequency, which is output from the frequency ratio measuring section 5, is input to the comparator 13 by performing the predetermined processing through the loop filter 12. For example, in a case of using a lowpass filter as the loop filter 12, the loop filter 12 cuts off or reduces a frequency component which is equal to or greater than a predetermined cutoff frequency. Further, a signal indicating a target value of the frequency is input to the comparator 13. Thus, the comparator 13 compares the target value with the frequency ratio indicated by the signal which is output from the loop filter 12.

A frequency ratio difference signal, which indicates a difference between the target value as a comparison result of the comparator 13 and a frequency ratio indicated by the signal that is output from the loop filter 12, becomes $k_0$ times its original through the gain section 16, is integrated by the integrating section 71, and is input as a digital control signal of the digital control oscillator 17 to the digital control oscillator 17. Thereby, the oscillating frequency of the digital control oscillator 17, that is, the frequency of the clock signal, which is output from the digital control oscillator 17, is adjusted, and is converged into the target value.

According to the above-mentioned fifth embodiment, it is also possible to exhibit the same effect as that of the above-mentioned first embodiment.

In the frequency synthesizer 1, it is possible to further reduce the idle tone.

That is, even in a case where there is no shift in any of the clock signal and the reference signal, due to the effect of fluctuation in signal, for example, it is possible to reduce the idle tone by a degree of $1/n^{1/2}$.

In a case where the phase of at least one of the clock signal or the reference signal is shifted, for example, it is possible to reduce the idle tone by a degree of 1/n.

It should be noted that the fifth embodiment can be applied to each embodiment.

Sixth Embodiment

Figure 23:
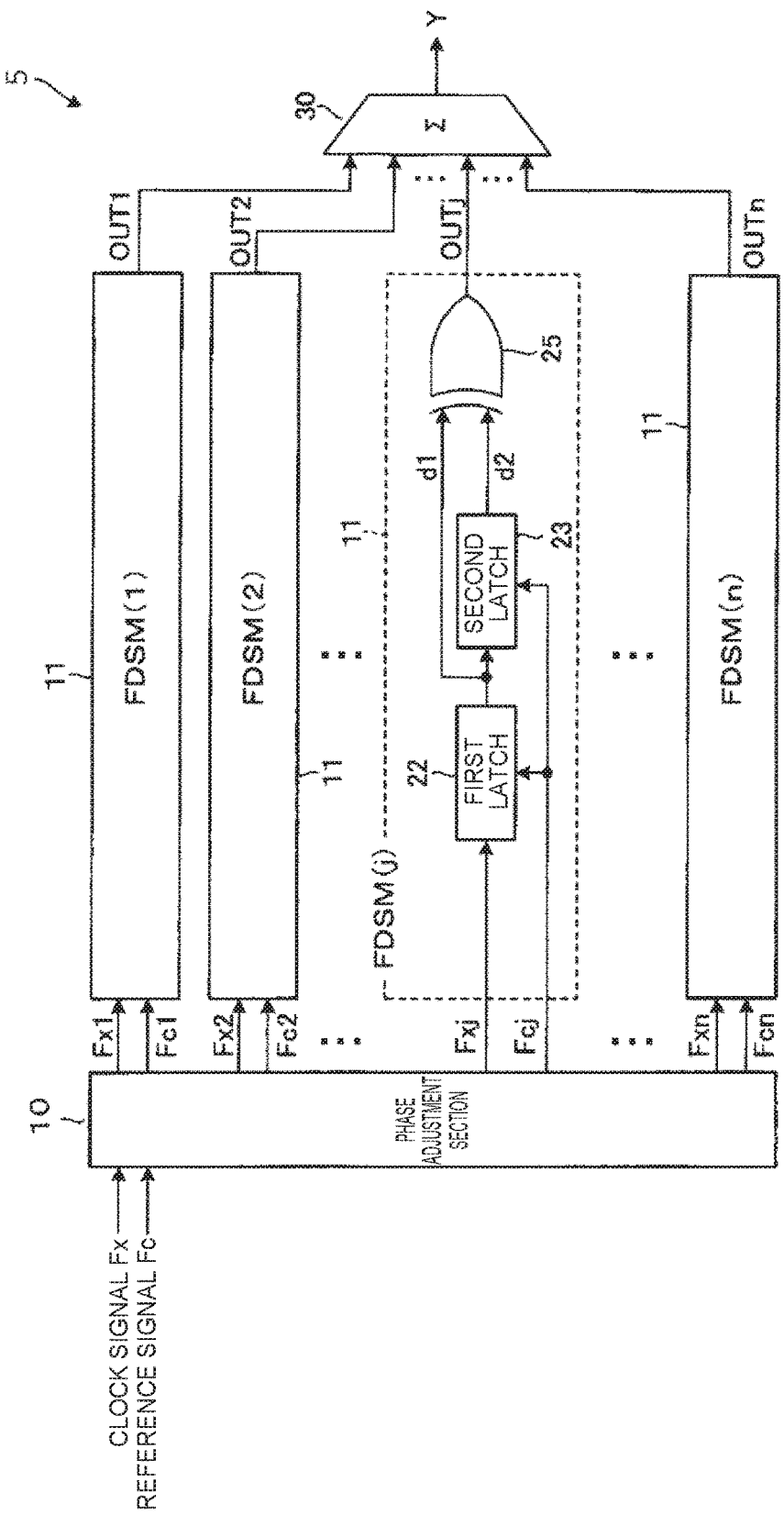
FIG. 23 is a block diagram illustrating the frequency ratio measuring section in a sixth embodiment of the frequency synthesizer according to the invention.

FIG. 23 is a block diagram illustrating a frequency ratio measuring section in a sixth embodiment of the frequency synthesizer according to the invention.

Hereinafter, the sixth embodiment will be described centering on different points between the above-mentioned fifth embodiment and the sixth embodiment, and the same points therebetween will not be described.

As shown in FIG. 23, in the frequency synthesizer 1 of the sixth embodiment, each FDSM 11 of the frequency ratio measuring section 5 is the FDSM having the bit stream configuration. As the FDSM 11, it is possible to use the same FDSM described in the first embodiment.

Hereinafter, the frequency ratio measuring section 5 will be described in detail.

2-1: Overall Configuration

FIG. 23 is a block diagram illustrating the frequency ratio measuring section 5 according to the sixth embodiment. The frequency ratio measuring section 5 has the same configuration as that of the frequency ratio measuring section 5 of the fifth embodiment shown in FIG. 9 except for the detailed configuration of the FDSMs (1) to (j).

The FDSM (j) includes: the first latch 22 that latches the output clock signal Fxj in synchronization with the rising edge of the output reference signal Fcj and outputs the first data d1; the second latch 23 that latches the first data d1 in synchronization with the rising edge of the output reference signal Fcj and outputs the second data d2; and an exclusive OR circuit 25 that calculates a value of exclusive OR of the first data d1 and the second data d2 and generates the output data OUTj. The first latch 22 and the second latch 23 are formed as, for example, D flip-flop circuits. In addition, the FDSMs (1) to (j−1) and the FDSMs (j+1) to (n) are formed in a manner similar to that of the FDSM (j).

This FDSM (j) of the sixth embodiment is different from the FDSM (j) of the fifth embodiment shown in FIG. 9 in terms of the following. In the fifth embodiment, the first latch 22 holds the count data Dc, and outputs an increment of the count data Dc, which is obtained by counting up the rising edges of the output clock signal Fxj observed over time during transition of the output reference signal Fcj for the single period, as the output data OUTj. In contrast, in the sixth embodiment, the first latch 22 maintains the output clock signal Fxj in a high or low state, and outputs the even or odd number of inversions, which is obtained over time during transition of the output reference signal Fcj for the single period, as the output data OUTj (outputs 0 if the number of inversions is even or outputs 1 if the number is odd).

However, the single period of the output clock signal Fxj is formed of two operations of inversion transition between high and low. Therefore, a degree of change of the output data OUTj caused by the fluctuation in the output clock signal Fxj relative to the output reference signal Fcj is twice a degree of change thereof in a case where the count value of FIG. 9 is held. Accordingly, behavior of the idle tone in the FDSM (j) having the bit stream configuration coincides with behavior thereof in a case where the output clock signal Fxj of twice the frequency is input to the FDSM (j), in the FDSM (j) of FIG. 9. Regarding the operations of the FDSM (j) of the sixth embodiment, in view of the properties, as necessary, a frequency fx of the output clock signal Fxj may be replaced with a frequency 2fx.

2-2: Case where Frequency 2fx is Higher than Frequency Fc

Next, a case where the frequency 2fx (corresponding to the clock signal Fx) is higher than the frequency fc of the reference signal Fc will be described. As the clock signal Fx, a signal (47.619047 kHz) at a single period of 21 μS is considered. Further, as the reference signal Fc, a signal (15.15 kHz) at a single period of 66 μS is considered. The single period of the clock signal Fx is formed of two operations of inversion transition between high and low, and is thus hereinafter regarded as a value twice the frequency fx. This corresponds to a case where the double frequency 2fx of the clock signal Fx is higher than the frequency fc of the reference signal Fc, and a frequency ratio of 2fx:fc is given by the following expression.

$$2fx:fc=2/21e^{-6}:1/66e^{-6}=44:7$$

In this case, a time for 44 inversion transition operations of the clock signal Fx is equal to a time of 7 periods of the reference signal Fc. That is, the same data sequence is repeated for each time period of 21/2 μS×44=66 μS×7=462 μS.

Figure 24:
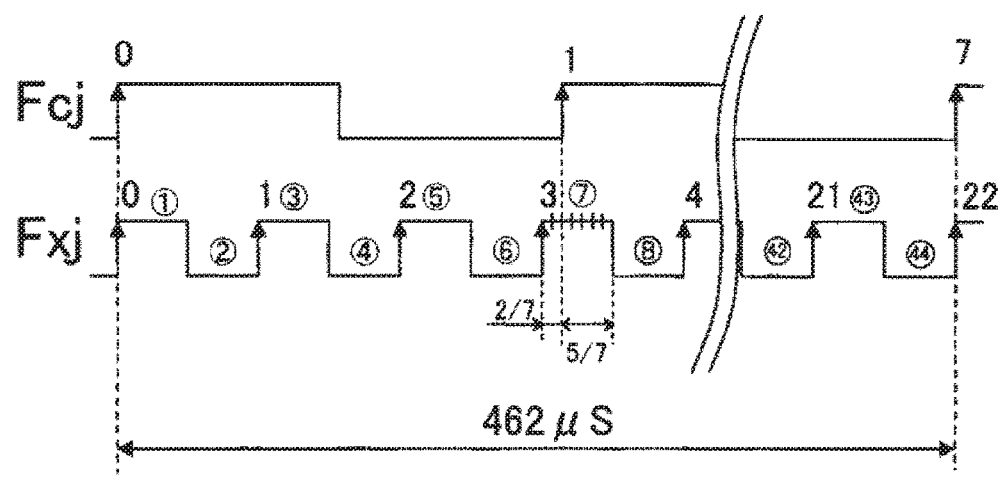
FIG. 24 is a timing chart illustrating examples of the output reference signal and the output clock signal.

The operation of the FDSM (j) at this time is as follows. While the output reference signal Fcj advances by a single period, the inversion transition is performed 44/7=6+2/7 times on the output clock signal Fxj. FIG. 24 shows such a relationship in which a starting point is set in a case where the rising edges of the output reference signal Fcj and the output clock signal Fxj coincide with each other.

Figure 25:
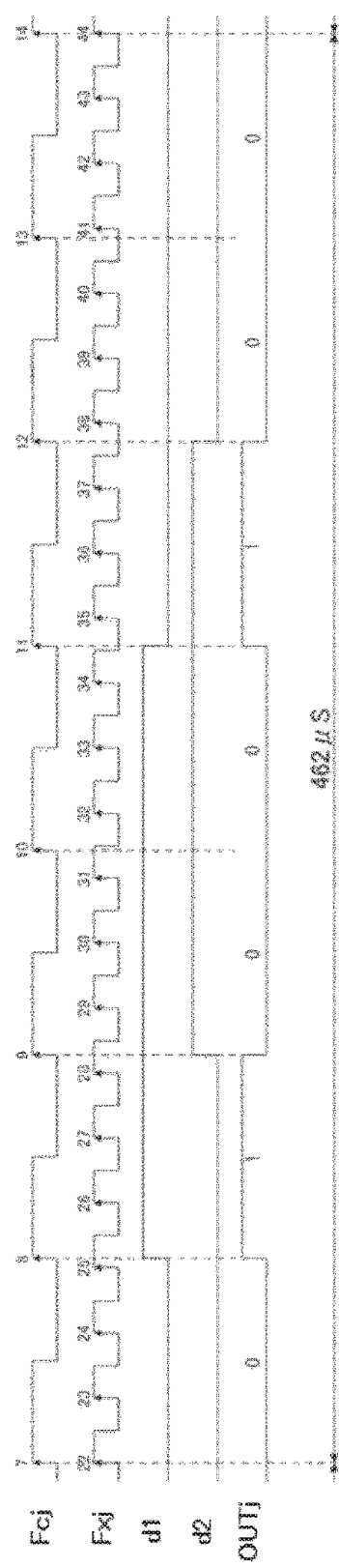
FIG. 25 is a timing chart illustrating an example of output data of an FDSM.

In the data sequence of the output data OUTj of actual FDSM (j), a bit sequence of "0100100" as shown in FIG. 25 appears at a period of 462 μS. In addition, the FDSM (j) of FIG. 23 has an indeterminate output of the first latch 22 and the second latch 23 at the time of initiating the operation, and FIG. 25 shows a repeated pattern of the second circulation subsequent to the first circulation of the period of 462 μS.

The behavior of the FDSM (j) corresponding to a bit stream which is "2fx>fc" coincides with the behavior in a case where a signal having a frequency two times of the frequency of the clock signal Fx is input into the FDSM (j), in the FDSM (j) corresponding to a data stream shown in FIG. 9. Thus, the delay may be performed such that the half period of the clock signal Fx is divided based on the half period.

Figure 26:
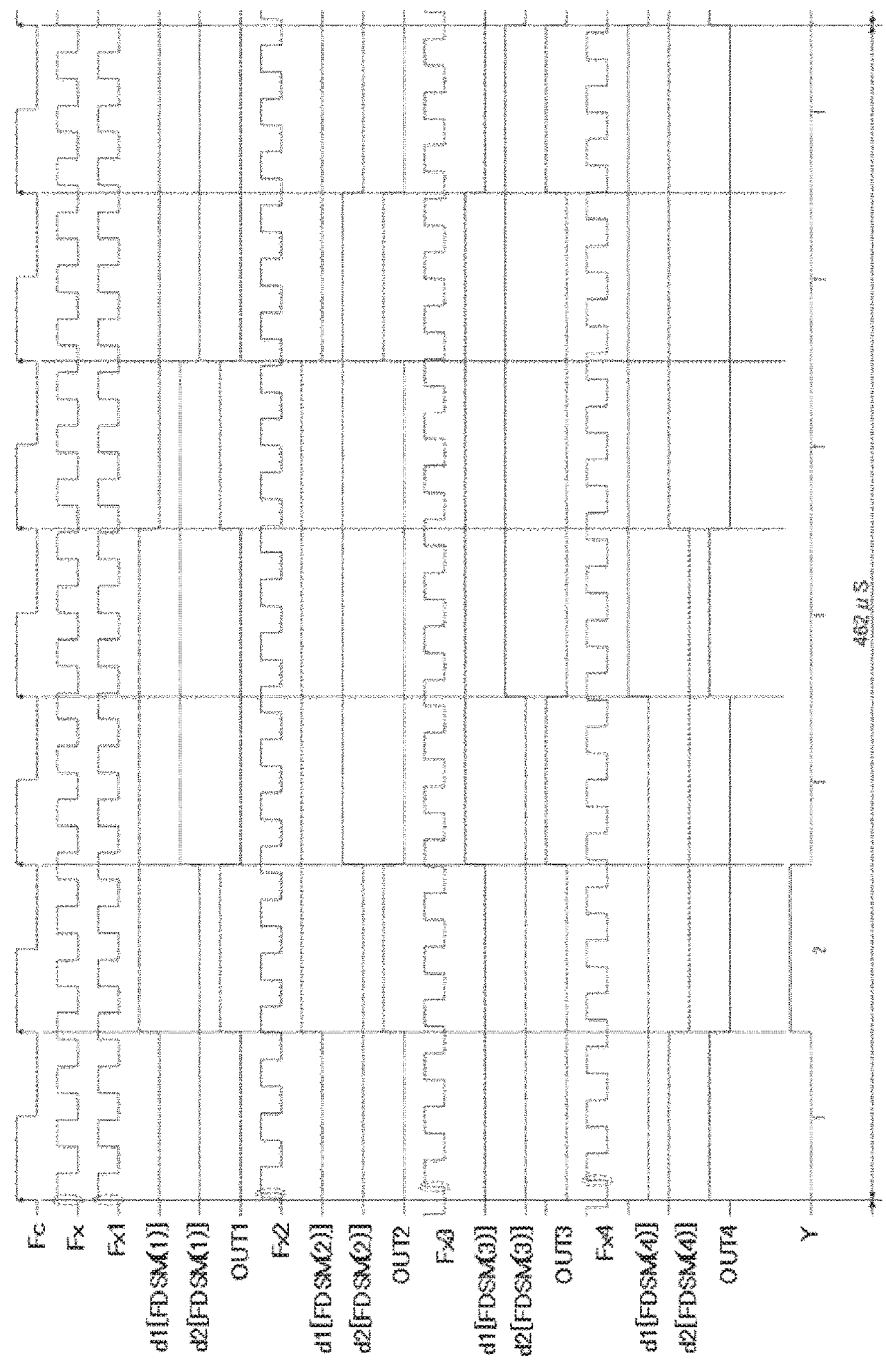
FIG. 26 is a timing chart in a case where n is 4 in the frequency ratio measuring section shown in FIG. 23.

In a case where n is 4, the configuration shown in FIG. 16 may be applied. Here, a delay time of the delay circuits DLx1 to DLx3 may be a time obtained by equivalently dividing the half period of the clock signal Fx into four (21/8 μS). In this case, a timing chart is as shown in FIG. 26, and the initial position of the repeated pattern of the output data OUT1 to OUT4 is shifted, and thus the idle tone is dispersed.

Figure 27:
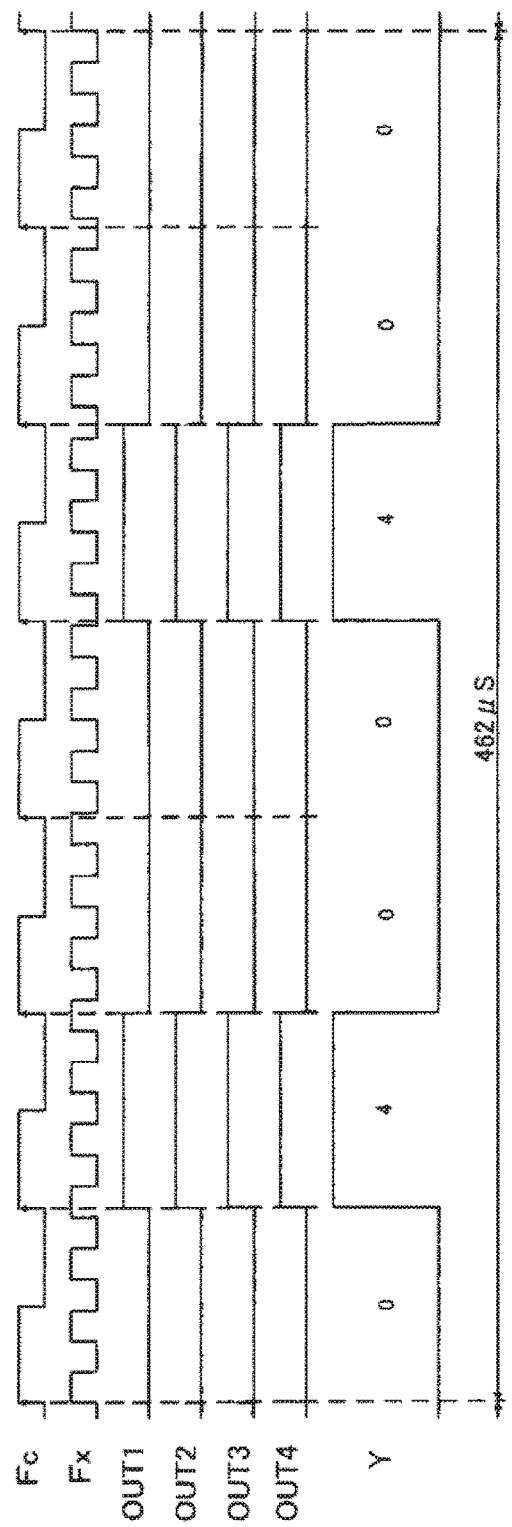
FIG. 27 is a timing chart of a device in which the phase adjustment section is deleted from the frequency ratio measuring section shown in FIG. 23.

If the clock signal Fx is not delayed and the four FDSMs (1) to (4) are simply parallelized as shown in FIG. 13, a timing chart thereof is shown in FIG. 27. In this case, the initial positions of the repeated pattern of the output data OUT1 to OUT4 coincide with each other. Thus, it is difficult to improve the SN ratio of the frequency delta sigma modulation signal Y. Here, compared with the case of using the FDSM solely as the frequency ratio measuring section 5, the idle tone is reduced, and the SN ratio is improved.

2-3: Case where Frequency Fc is Higher than Frequency 2fx

Next, a case where the frequency fc of the reference signal Fc is higher than the double frequency 2fx of the clock signal Fx will be described.

In the operation of the FDSM (j) (j is a natural number of n or less), a signal (15.15 kHz) at a single period of 66μS is considered as the clock signal Fx, and a signal (47.619047 kHz) at a single period of 21 μS is considered as the reference signal Fc instead of the frequency relationship in an example of FIG. 24. The single period of the clock signal Fx is formed of two operations of inversion transition between high and low, and is thus hereinafter regarded as a value twice the frequency fx. This corresponds to a case where the frequency fc of the reference signal Fc is higher than the double frequency 2fx of the clock signal Fx, and a frequency ratio of 2fx:fc is given by the following expression.

$$2fx:fc=2/66e^{-6}:1/21e^{-6}=7:11$$

Figure 28:
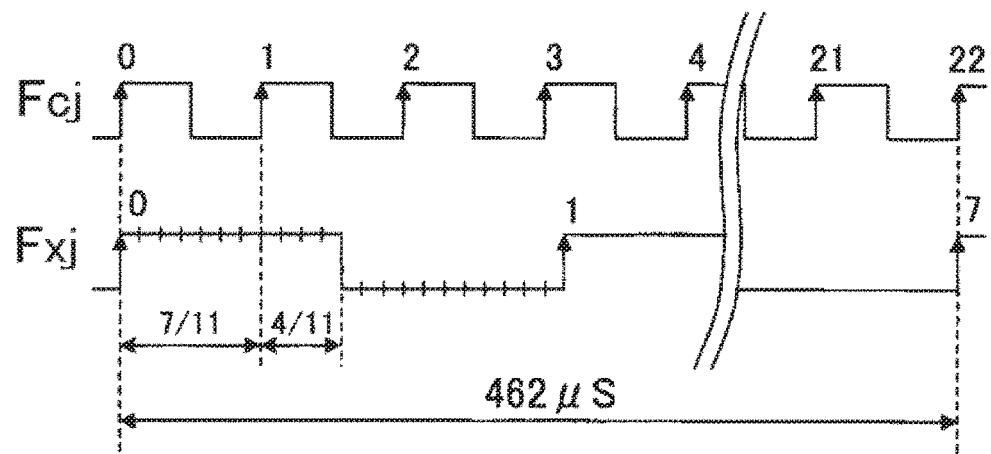
FIG. 28 is a timing chart illustrating examples of the output reference signal and the output clock signal.

Therefore, a time of 7 periods of the clock signal Fx is equal to a time of 11 period of the reference signal Fc, and the same data sequence is repeated for each time period of 66/2 μS×7=21 μS×11=231 μS. As the operation of the FDSM (j), as shown in FIG. 28, when the moment at which the rising edges of the output reference signal Fcj and the output clock signal Fxj coincide with each other is set as an origination, the output reference signal Fcj advances by 7/22 periods while the output clock signal Fxj advances for a single period, and is thus inversion transitioned 7/22×2=7/11 times.

Figure 29:
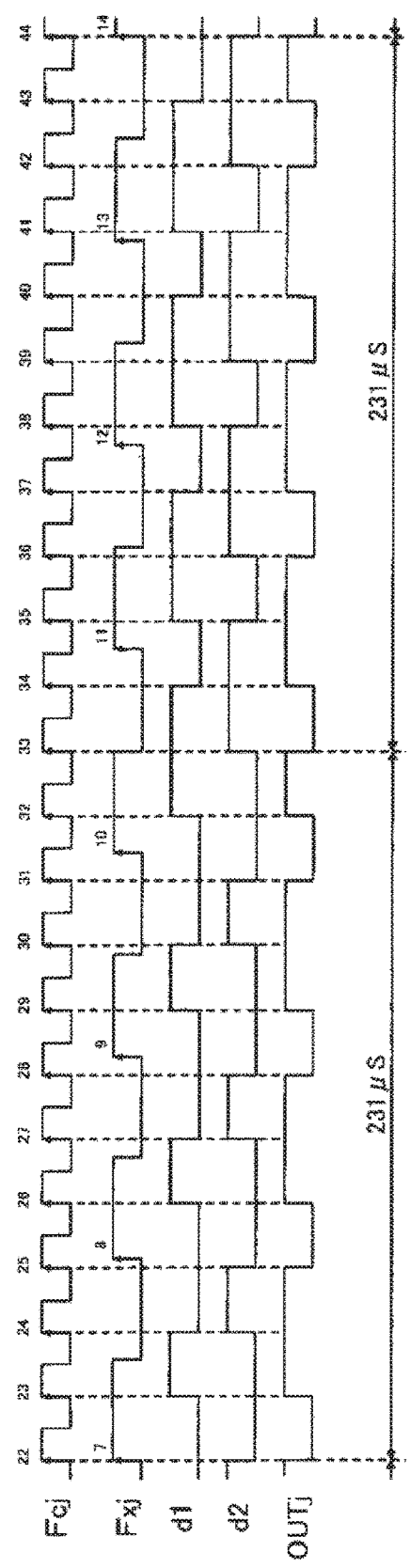
FIG. 29 is a timing chart illustrating an example of output data of an FDSM.

In this case, as shown in FIG. 29, in the output data OUTj of the FDSM (j), a bit sequence of a period of 231 μS "01101101101" appears. In addition, in the FDSM (j) of FIG. 23, the outputs of the first latch 22 and the second latch 23 at the time of initiating the operation are not determined, and FIG. 29 shows a bit sequence of the second circulation subsequent to the first circulation of the bit sequence.

Figure 30:
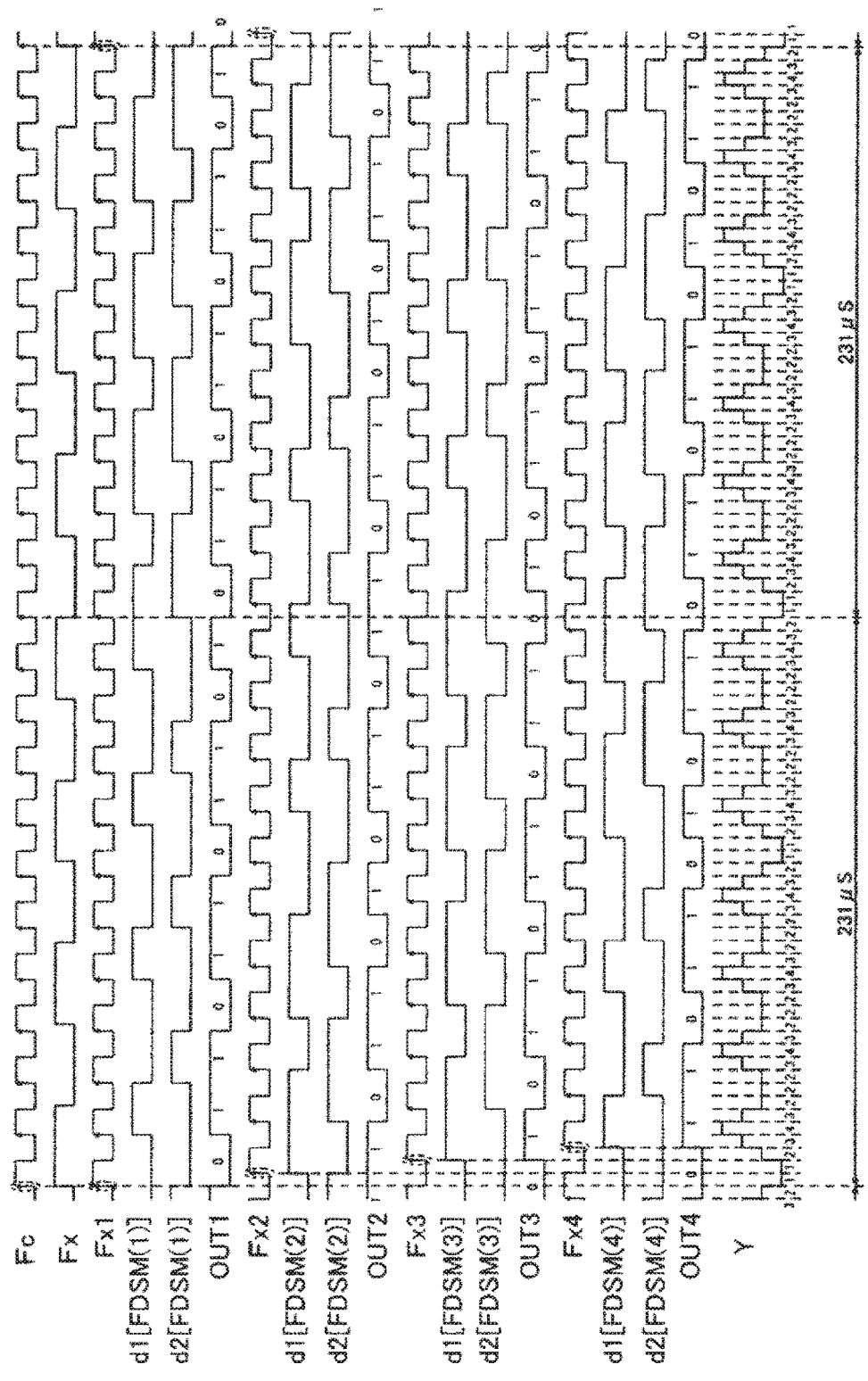
FIG. 30 is a timing chart in a case where n is 4 in the frequency ratio measuring section shown in FIG. 23.

In a case where n is 4, the configuration shown in FIG. 18 may be applied. Here, a delay time of the delay circuits DLc1 to DLc3 may be a time obtained by dividing the single period of the reference signal Fc into four (21/4 µS). In this case, a timing chart is as shown in FIG. 30, and the initial position of the repeated pattern of the output data OUT1 to OUT4 is shifted, and thus the idle tone is dispersed.

Figure 31:
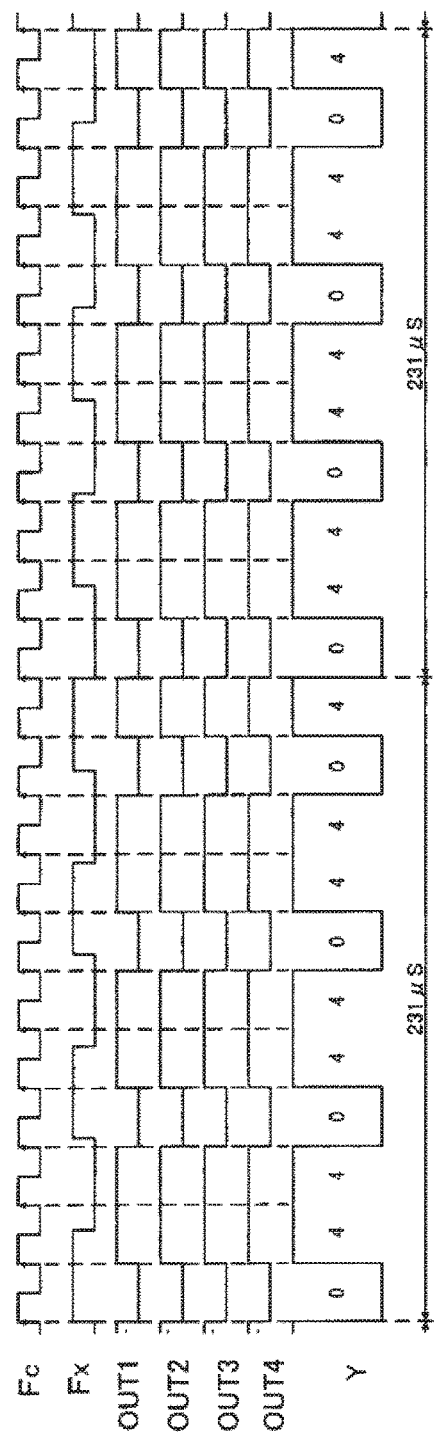
FIG. 31 is a timing chart of a device in which the phase adjustment section is deleted from the frequency ratio measuring section shown in FIG. 23.

If the clock signal Fx is not delayed and the four FDSMs (1) to (4) are simply parallelized as shown in FIG. 13, a timing chart thereof is shown in FIG. 31. In this case, the initial positions of the repeated pattern of the output data OUT1 to OUT4 coincide with each other. Thus, it is difficult to improve the SN ratio of the frequency delta sigma modulation signal Y. Here, compared with the case of using the FDSM solely as the frequency ratio measuring section 5, the idle tone is reduced, and the SN ratio is improved.

In the frequency ratio measuring section 5 of the sixth embodiment, FDSMs (1) to (n) generate the output data OUT1 to OUTn in a beat stream format. In addition, as described above, assuming that the shorter period of the half period of the clock signal Fx and the single period of the reference signal Fc is Tx, the phase adjustment section 10 sequentially delays one of the clock signal Fx and the reference signal Fc by Tx/n, and generates the output clock signals Fx1 to Fxn and the output reference signals Fc1 to Fcn.

In a similar manner to that of the frequency ratio measuring section 5 of the fifth embodiment, in the frequency ratio measuring section 5 of the sixth embodiment, the phase adjustment section 10 may relatively adjust the phase between the clock signal Fx and the reference signal Fc such that the phase of the idle tone which overlaps with the output data OUT1 to OUTn is shifted by Tx/n, and may generate the n groups of output clock signals and output reference signals (Fx1, Fc1), (Fx2, Fc2), . . . , and (Fxn, Fcn).

Specifically, when the phase difference between the output clock signal Fxi and the output reference signal Fci supplied to i-th (i is an arbitrary natural number of n−1 or less) FDSM (i) is Pi, the phase adjustment section 10 may generate the n groups of output clock signals and output reference signals (Fx1, Fc1), (Fx2, Fc2), . . . , and (Fxn, Fcn) by relatively adjusting the phase between the clock signal Fx and the reference signal Fc such that Tx/n=Pi+1-Pi.

According to the above-mentioned sixth embodiment, it is also possible to exhibit the same effect as that of the above-mentioned fifth embodiment.

It should be noted that the sixth embodiment can be applied to each embodiment.

Seventh Embodiment

Figure 32:
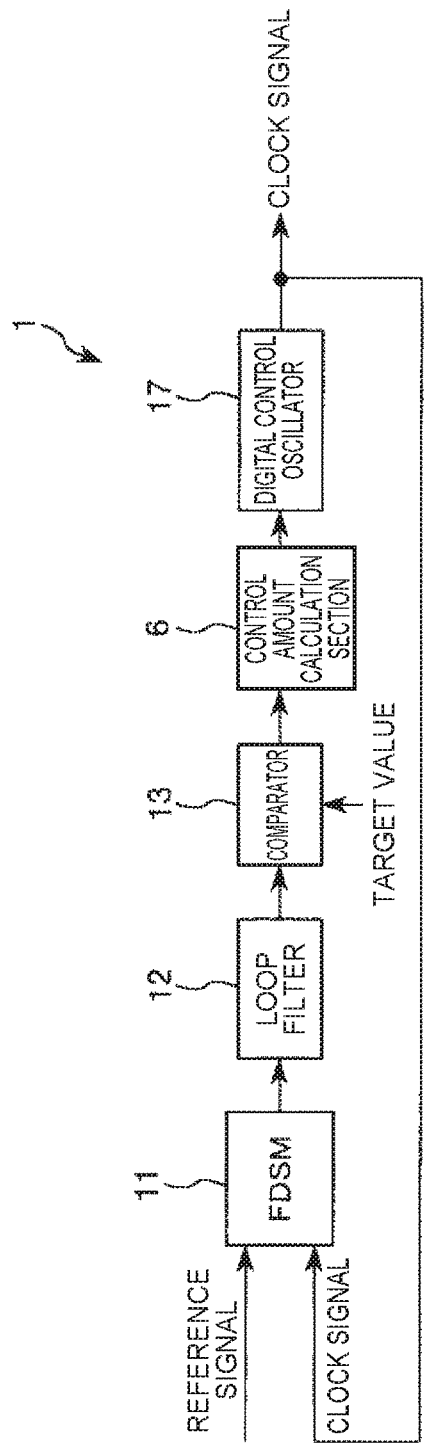
FIG. 32 is a block diagram illustrating a seventh embodiment of the frequency synthesizer according to the invention.
Figure 33:
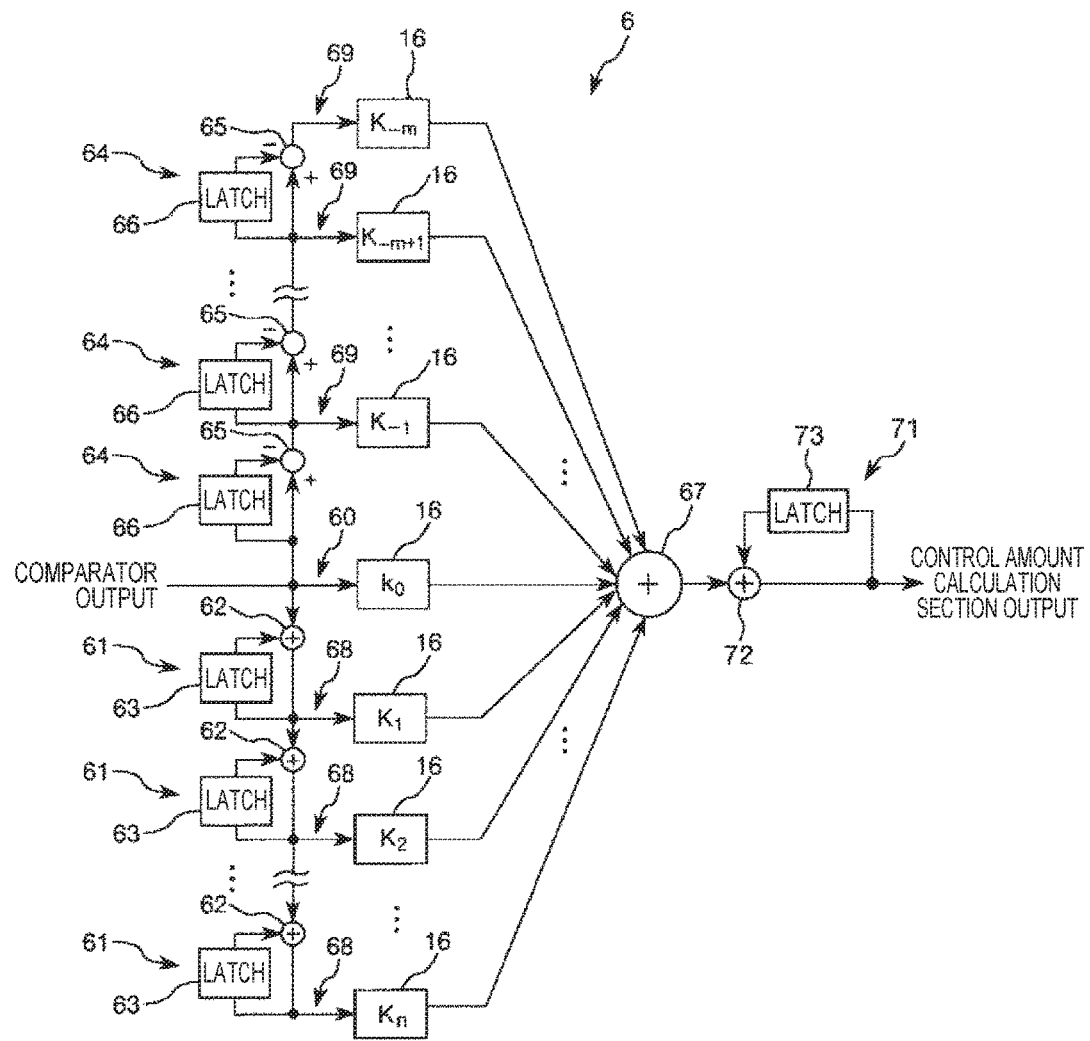
FIG. 33 is a block diagram illustrating a control amount calculation section of the frequency synthesizer shown in FIG. 32.

FIG. 32 is a block diagram illustrating a seventh embodiment of the frequency synthesizer according to the invention. FIG. 33 is a block diagram illustrating a control amount calculation section of the frequency synthesizer shown in FIG. 32.

Hereinafter, the seventh embodiment will be described centering on different points between the above-mentioned first embodiment and the seventh embodiment, and the same points therebetween will not be described.

As shown in FIG. 32, the frequency synthesizer 1 of the seventh embodiment has the FDSM 11, the loop filter 12, the comparator 13, a control amount calculation section 6, and a digital control oscillator (DCO) 17 which is an example of the oscillating section and controls the oscillating frequency on the basis of the digital signal. The FDSM 11, the loop filter 12, the comparator 13, the control amount calculation section 6, and the digital control oscillator 17 are connected to the output side in this order.

By using the digital control oscillator 17 as the oscillating section, it is possible to obtain an output which is stable even when there is environmental change such as temperature change.

The control amount calculation section 6 has a function of calculating a control amount of the digital control oscillator 17 on the basis of the comparison result of the comparator 13. Hereinafter, the control amount calculation section 6 will be described.

As the control amount calculation section 6, it is possible to employ various forms. In the present embodiment, a general form of the control amount calculation section 6 will be described. Specific configuration examples will be described in eighth to thirteenth embodiments to be described later.

As shown in FIG. 33, the control amount calculation section 6 has a gain section 16 of which the gain is set as $k_0$, n (in the configuration shown in the drawing, n is a natural number of 2 or more) integrating sections 61 each of which is formed of a latch 63 and an adder 62, a gain section 16 of which the gain is set as $k_1$, a gain section 16 of which the gain is set as $k_2$, . . . , a gain section 16 of which the gain is set as $k_n$, m (in the configuration shown in the drawing, m is a natural number of 2 or more) differentiating sections 64 each of which is formed of a latch 66 and a subtractor 65, a gain section 16 of which the gain is set as $k_{-1}$, . . . , a gain section 16 of which the gain is set as $k_{-m+1}$, a gain section 16 of which the gain is set as $k_{-m}$, an adder 67, and an integrating section 71. A value of the gain of each gain section 16 is not particularly limited, and is appropriately set in accordance with various conditions.

In the present embodiment, the integrating section 71 is formed of an adder 72 and a latch 73, is disposed at the next stage of the adder 67, and is configured such that the adder 72 adds current data and data, which is previous by one piece to the current data and is latched on the latch 73.

In the present embodiment, in order to facilitate understanding of the control amount calculation section 6, the above-mentioned configuration has been exemplified. However, as described later, it is not essential for the control amount calculation section 6 to have the entire configuration. Further, descriptions of the parts of " . . . " will be omitted.

First, the gain section 16, of which the gain is $k_0$, constitutes a first circuit section 60 that outputs a predetermined value times the comparison result of the comparator 13.

The integrating section 61 and the gain section 16, of which the gain is $k_1$, constitute a second circuit section 68 that outputs a predetermined value times a value which is obtained by integrating the comparison result of the comparator 13 once.

The two integrating sections 61, which are connected in series, and the gain section 16, of which the gain is $k_2$, constitute the second circuit section 68 that outputs a predetermined value times a value which is obtained by integrating the comparison result of the comparator 13 twice.

The n integrating sections 61, which are connected in series, and the gain section 16, of which the gain is $k_n$, constitute the second circuit section 68 that outputs a predetermined value times a value which is obtained by integrating the comparison result of the comparator 13 n times.

Then, the multiple (multiple types of) second circuit sections 68 each having a different number of the integration operations constitute a second circuit section group.

The differentiating section 64 and the gain section 16, of which the gain is $k_{-1}$, constitute a third circuit section 69 that outputs a predetermined value times a value which is obtained by differentiating the comparison result of the comparator 13 once.

The (m−1) differentiating sections 64, which are connected in series, and the gain section 16, of which the gain is $k_{-m+1}$, constitute the third circuit section 69 that outputs a predetermined value times a value which is obtained by differentiating the comparison result of the comparator 13 (m−1) times.

The m differentiating sections 64, which are connected in series, and the gain section 16, of which the gain is $k_{-m}$, constitute the third circuit section 69 that outputs a predetermined value times a value which is obtained by differentiating the comparison result of the comparator 13 m times.

Then, the multiple (multiple types of) third circuit sections 69 each having a different number of the integration operations constitute a third circuit section group.

By providing such a control amount calculation section 6, it is possible to perform various feedback controls such as a PD control for the frequency, a PI control for the frequency, a PID control for the frequency, a PD control for the phase, a PI control for the phase, a PID control for the phase, and a $PIDD^2$ control for the phase. It should be noted that the "P" indicates a proportion, the "I" indicates integration, the "D" indicates differential, and the "$D^2$" indicates second-order differential.

Here, it is not essential for the control amount calculation section 6 to include all of the first circuit section 60, the multiple different second circuit sections 68 of the second circuit section group, and the multiple different third circuit sections 69 of the third circuit section group.

That is, the control amount calculation section 6 may include at least two different circuit sections selected from the first circuit section 60, the multiple different second circuit sections 68 of the second circuit section group, and the multiple different third circuit sections 69 of the third circuit section group. Accordingly, the control amount calculation section 6 may include, for example, the multiple different circuit sections of the second circuit section group, the adder 67, and the integrating section 71, and may include the multiple different circuit sections of the third circuit section group, the adder 67, and the integrating section 71.

Next, operations of the frequency synthesizer 1 will be described.

As shown in FIG. 32, the components up to the comparator 13 are the same as those of the first embodiment. A frequency ratio difference signal (output signal of the comparator 13), which indicates a difference between the target value as the comparison result of the comparator 13 and the frequency indicated by the signal that is output from the FDSM 11, is input to the control amount calculation section 6.

The control amount calculation section 6 calculates the control amount of the digital control oscillator 17 on the basis of the frequency ratio difference signal. It should be noted that the method of calculating the control amount is different depending on the configuration of the control amount calculation section 6. Here, a description thereof will be omitted.

The signal, which indicates the control amount that is output from the control amount calculation section 6, is input as the digital control signal of the digital control oscillator 17 to the digital control oscillator 17.

Thereby, the oscillating frequency of the digital control oscillator 17, that is, the frequency of the clock signal, which is output from the digital control oscillator 17, is adjusted, and is converged into (locked onto) the target value. Alternatively, the phase and the frequency of the clock signal, which is output from the digital control oscillator 17, are adjusted. Thus, the phase is converged to a predetermined value, and the frequency is converged to the target value.

According to the above-mentioned seventh embodiment, with a simple configuration, it is possible to lock at least one of the frequency or the phase of the clock signal which is output from the digital control oscillator 17. Further, it is possible to exhibit the same effect as that of the above-mentioned first embodiment.

All the processed signals are digital signals, and are highly resistant to noise. Thereby, it is possible to obtain high accuracy.

Since the control amount calculation section 6 has multiple types of the circuit sections, an adjustment range of the gain increases, and thus stability, transient characteristics, steady-state characteristics, and the like can be improved.

Eighth Embodiment

Figure 34:
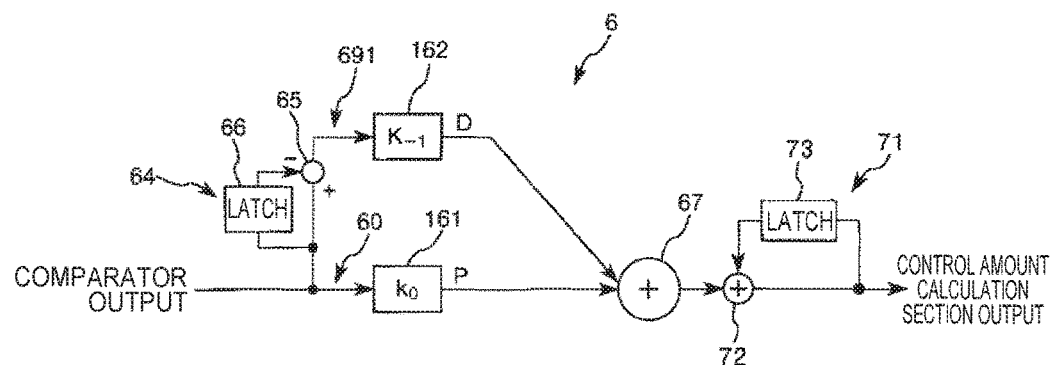
FIG. 34 is a block diagram illustrating a control amount calculation section in an eighth embodiment of the frequency synthesizer according to the invention.

FIG. 34 is a block diagram illustrating a control amount calculation section in an eighth embodiment of the frequency synthesizer according to the invention.

Hereinafter, the eighth embodiment will be described centering on different points between the above-mentioned seventh embodiment and the eighth embodiment, and the same points therebetween will not be described.

As shown in FIG. 34, the frequency synthesizer 1 of the eighth embodiment is configured to perform adjustment by performing the PD control for the frequency.

The control amount calculation section 6 has a gain section 161 of which the gain is $k_0$, the differentiating section 64 which is formed of the latch 66 and the subtractor 65, a gain section 162 of which the gain is $k_{-1}$, the adder 67, and the integrating section 71.

The gain section 161 constitutes the first circuit section 60, and P control is performed on the frequency by using the signal which is output from the first circuit section 60.

The differentiating section 64 and the gain section 162 constitute a third circuit section 691, and D control is performed on the frequency by using the signal which is output from the third circuit section 691.

The signal, which is output from the first circuit section 60, and the signal, which is output from the third circuit section 691, are added up by the adder 67, are integrated by the integrating section 71, and are output from the control amount calculation section 6.

According to the above-mentioned eighth embodiment, it is also possible to exhibit the same effect as that of the above-mentioned seventh embodiment.

In the eighth embodiment, with a simple configuration, it is possible to lock the frequency of the clock signal which is output from the digital control oscillator 17.

It is possible to improve transient response characteristics, and it is possible to reduce the time period necessary for the locking as compared with the P control.

Ninth Embodiment

Figure 35:
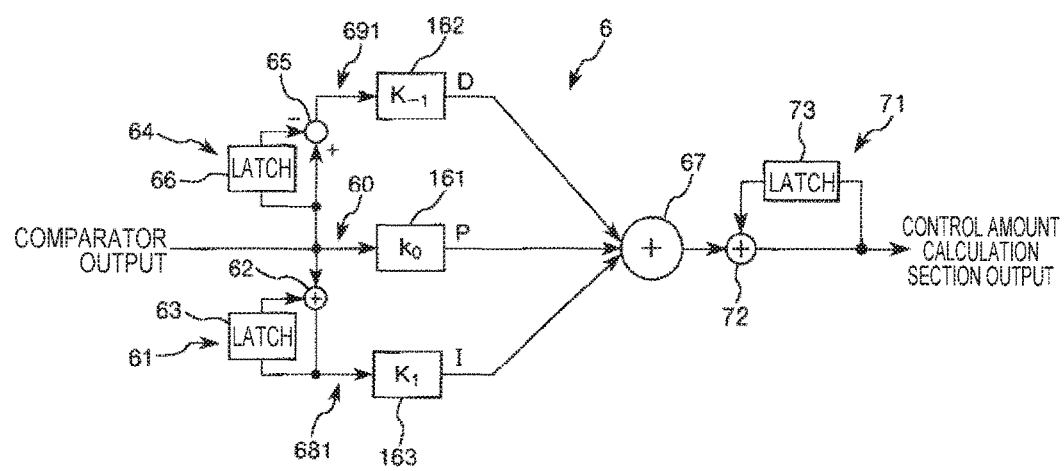
FIG. 35 is a block diagram illustrating a control amount calculation section in a ninth embodiment of the frequency synthesizer according to the invention.

FIG. 35 is a block diagram illustrating a control amount calculation section in a ninth embodiment of the frequency synthesizer according to the invention.

Hereinafter, the ninth embodiment will be described centering on different points between the above-mentioned seventh embodiment and the ninth embodiment, and the same points therebetween will not be described.

As shown in FIG. 35, the frequency synthesizer 1 of the ninth embodiment is configured to perform adjustment by performing the PID control for the frequency.

The control amount calculation section 6 has the gain section 161 of which the gain is $k_0$, the integrating section 61 which is formed of the latch 63 and the adder 62, a gain section 163 of which the gain is $k_1$, the differentiating section 64 which is formed of the latch 63 and the subtractor 65, the gain section 162 of which the gain is $k_{-1}$, the adder 67, and the integrating section 71.

The gain section 161 constitutes the first circuit section 60, and P control is performed on the frequency by using the signal which is output from the first circuit section 60.

The integrating section 61 and the gain section 163 constitute the second circuit section 681, and I control is performed on the frequency by using the signal which is output from the second circuit section 681.

The differentiating section 64 and the gain section 162 constitute the third circuit section 691, and D control is performed on the frequency by using the signal which is output from the third circuit section 691.

The signal, which is output from the first circuit section 60, the signal, which is output from the second circuit section 681, and the signal, which is output from the third circuit section 691, are added up by the adder 67, are integrated by the integrating section 71, and are output from the control amount calculation section 6.

According to the above-mentioned ninth embodiment, it is also possible to exhibit the same effect as that of the above-mentioned seventh embodiment.

In the ninth embodiment, with a simple configuration, it is possible to lock the frequency and the phase of the clock signal which are output from the digital control oscillator 17.

It is possible to improve transient response characteristics, and it is possible to reduce the time period necessary for the locking. Further, it is possible to reduce a steady-state deviation between the frequency and the target value to zero.

Tenth Embodiment

Figure 36:
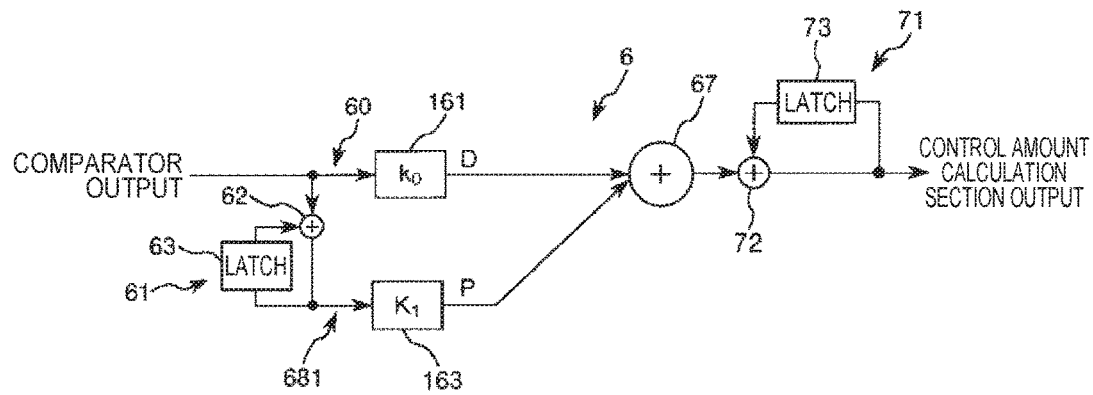
FIG. 36 is a block diagram illustrating a control amount calculation section in a tenth embodiment of the frequency synthesizer according to the invention.

FIG. 36 is a block diagram illustrating a control amount calculation section in a tenth embodiment of the frequency synthesizer according to the invention.

Hereinafter, the tenth embodiment will be described centering on different points between the above-mentioned seventh embodiment and the tenth embodiment, and the same points therebetween will not be described.

As shown in FIG. 36, the frequency synthesizer 1 of the tenth embodiment is configured to perform adjustment by performing the PD control for the phase.

The control amount calculation section 6 has the gain section 161 of which the gain is $k_0$, the integrating section 61 which is formed of the latch 63 and the adder 62, the gain section 163 of which the gain is $k_1$, the adder 67, and the integrating section 71.

The gain section 161 constitutes the first circuit section 60, and the D control is performed on the phase by using the signal which is output from the first circuit section 60.

The integrating section 61 and the gain section 163 constitute the second circuit section 681, and the P control is performed on the phase by using the signal which is output from the second circuit section 681.

The signal, which is output from the first circuit section 60, and the signal, which is output from the second circuit section 681, are added up by the adder 67, are integrated by the integrating section 71, and are output from the control amount calculation section 6.

According to the above-mentioned tenth embodiment, it is also possible to exhibit the same effect as that of the above-mentioned seventh embodiment.

In the tenth embodiment, with a simple configuration, it is possible to lock the frequency and the phase of the clock signal which are output from the digital control oscillator 17.

It is possible to improve transient response characteristics, and it is possible to reduce the time period necessary for the locking as compared with the P control.

Eleventh Embodiment

Figure 37:
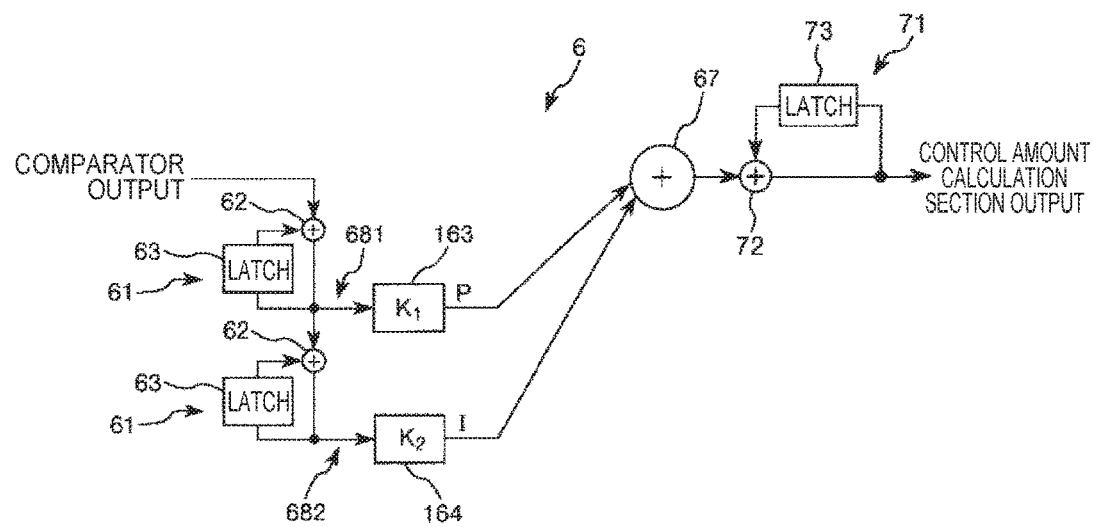
FIG. 37 is a block diagram illustrating a control amount calculation section in an eleventh embodiment of the frequency synthesizer according to the invention.

FIG. 37 is a block diagram illustrating a control amount calculation section in an eleventh embodiment of the frequency synthesizer according to the invention.

Hereinafter, the eleventh embodiment will be described centering on different points between the above-mentioned seventh embodiment and the eleventh embodiment, and the same points therebetween will not be described.

As shown in FIG. 37, the frequency synthesizer 1 of the eleventh embodiment is configured to perform adjustment by performing the PI control for the phase.

The control amount calculation section 6 has the two integrating sections 61 each of which is formed of the latch 63 and the adder 62, the gain section 163 of which the gain is $k_1$, a gain section 164 of which the gain is $k_2$, the adder 67, and the integrating section 71.

The integrating section 61 and the gain section 163 constitute the second circuit section 681, and the P control is performed on the phase by using the signal which is output from the second circuit section 681.

The two integrating sections 61, which are connected in series, and the gain section 164 constitute the second circuit section 682, and the I control is performed on the phase by using the signal which is output from the second circuit section 682.

The signal, which is output from the second circuit section 681, and the signal, which is output from the second circuit section 682, are added up by the adder 67, are integrated by the integrating section 71, and are output from the control amount calculation section 6.

According to the above-mentioned eleventh embodiment, it is also possible to exhibit the same effect as that of the above-mentioned seventh embodiment.

In the eleventh embodiment, with a simple configuration, it is possible to lock the frequency and the phase of the clock signal which are output from the digital control oscillator 17.

Further, it is possible to reduce a steady-state deviation between the frequency and the target value to zero.

Twelfth Embodiment

Figure 38:
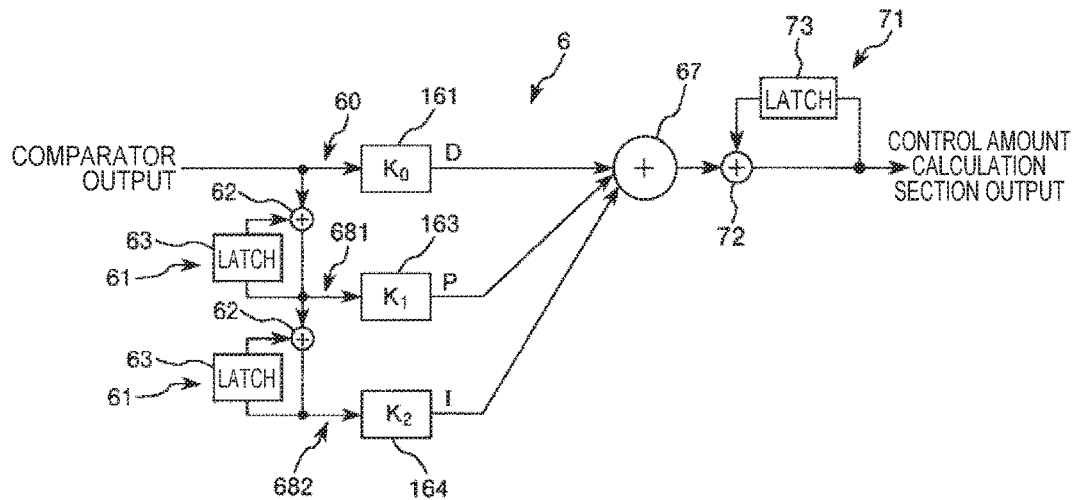
FIG. 38 is a block diagram illustrating a control amount calculation section in a twelfth embodiment of the frequency synthesizer according to the invention.

FIG. 38 is a block diagram illustrating a control amount calculation section in a twelfth embodiment of the frequency synthesizer according to the invention.

Hereinafter, the twelfth embodiment will be described centering on different points between the above-mentioned seventh embodiment and the twelfth embodiment, and the same points therebetween will not be described.

As shown in FIG. 38, the frequency synthesizer 1 of the twelfth embodiment is configured to perform adjustment by performing the PID control for the phase.

The control amount calculation section 6 has the gain section 161 of which the gain is $k_0$, the two integrating sections 61 each of which is formed of the latch 63 and the adder 62, the gain section 163 of which the gain is $k_1$, the gain section 164 of which the gain is $k_2$, the adder 67, and the integrating section 71.

The gain section 161 constitutes the first circuit section 60, and the D control is performed on the phase by using the signal which is output from the first circuit section 60.

The integrating section 61 and the gain section 163 constitute the second circuit section 681, and the P control is performed on the phase by using the signal which is output from the second circuit section 681.

The two integrating sections 61, which are connected in series, and the gain section 164 constitute the second circuit section 682, and the I control is performed on the phase by using the signal which is output from the second circuit section 682.

The signal, which is output from the first circuit section 60, the signal, which is output from the second circuit section 681, and the signal, which is output from the second circuit section 682, are added up by the adder 67, are integrated by the integrating section 71, and are output from the control amount calculation section 6.

According to the above-mentioned twelfth embodiment, it is also possible to exhibit the same effect as that of the above-mentioned seventh embodiment.

In the twelfth embodiment, with a simple configuration, it is possible to lock the frequency and the phase of the clock signal which are output from the digital control oscillator 17.

It is possible to improve transient response characteristics. Thus, compared with the P control and the PI control, it is possible to reduce the time period necessary for the locking. Further, it is possible to reduce a steady-state deviation between the frequency and the target value to zero.

Thirteenth Embodiment

Figure 39:
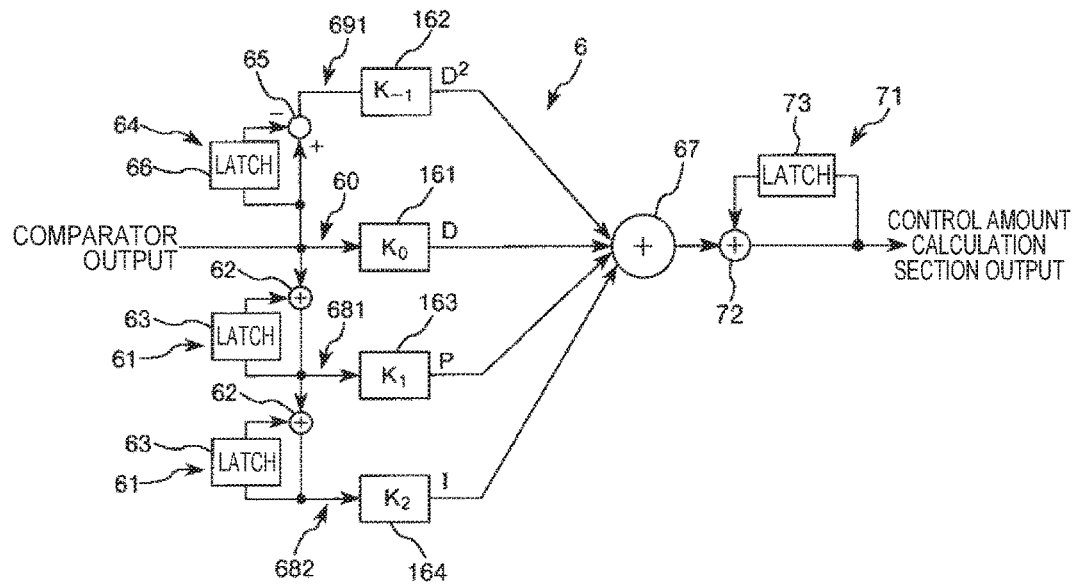
FIG. 39 is a block diagram illustrating a control amount calculation section in a thirteenth embodiment of the frequency synthesizer according to the invention.

FIG. 39 is a block diagram illustrating a control amount calculation section in a thirteenth embodiment of the frequency synthesizer according to the invention.

Hereinafter, the thirteenth embodiment will be described centering on different points between the above-mentioned seventh embodiment and the thirteenth embodiment, and the same points therebetween will not be described.

As shown in FIG. 39, the frequency synthesizer 1 of the thirteenth embodiment is configured to perform adjustment by performing the PIDD$^2$ (PIDD) control for the phase.

The control amount calculation section 6 has the gain section 161 of which the gain is $k_0$, the two integrating sections 61 each of which is formed of the latch 63 and the adder 62, the gain section 163 of which the gain is $k_1$, the gain section 164 of which the gain is $k_2$, the differentiating section 64 which is formed of the latch 66 and the subtractor 65, the gain section 162 of which the gain is $k_{-1}$, the adder 67, and the integrating section 71.

The gain section 161 constitutes the first circuit section 60, and the D control is performed on the phase by using the signal which is output from the first circuit section 60.

The integrating section 61 and the gain section 163 constitute the second circuit section 681, and the P control is performed on the phase by using the signal which is output from the second circuit section 681.

The two integrating sections 61, which are connected in series, and the gain section 164 constitute the second circuit section 682, and the I control is performed on the phase by using the signal which is output from the second circuit section 682.

The differentiating section 64 and the gain section 162 constitute the third circuit section 691, and D$^2$ control (second-order differential control) is performed on the phase by using the signal which is output from the third circuit section 691.

According to the above-mentioned thirteenth embodiment, it is also possible to exhibit the same effect as that of the above-mentioned seventh embodiment.

In the thirteenth embodiment, with a simple configuration, it is possible to lock the frequency and the phase of the clock signal which are output from the digital control oscillator 17.

It is possible to improve transient response characteristics. Thus, compared with the P control and the PI control, it is possible to reduce the time period necessary for the locking. Further, it is possible to reduce a steady-state deviation between the frequency and the target value to zero.

Even in a case where the adjustment range of the gain increases and particularly the dead period of the system is not ignorable, this configuration has a quick response property, and is thus highly resistant to disturbance.

Fourteenth Embodiment

Figure 40:
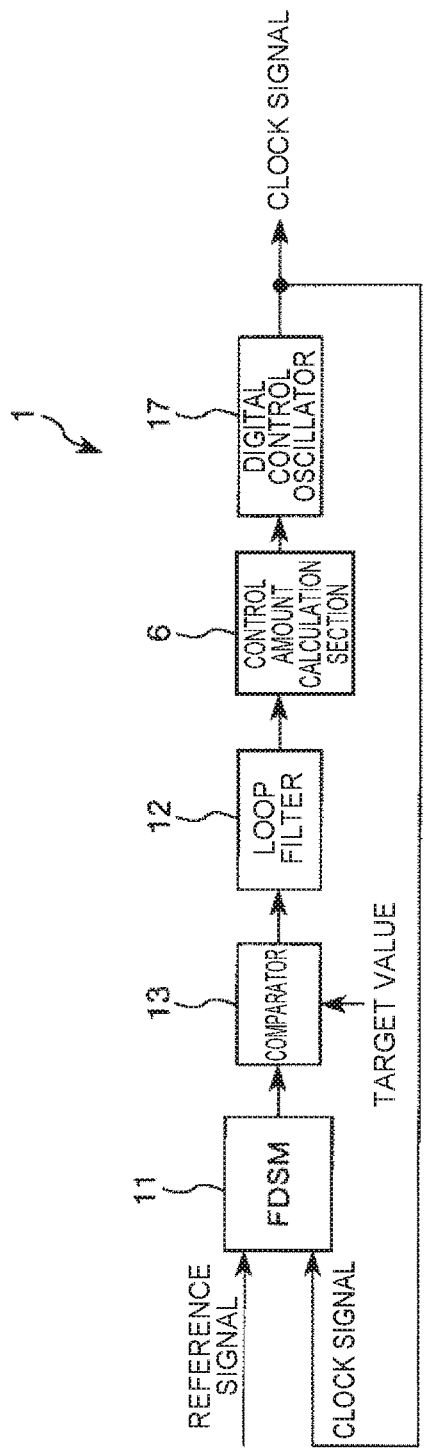
FIG. 40 is a block diagram illustrating a fourteenth embodiment of the frequency synthesizer according to the invention.

FIG. 40 is a block diagram illustrating a fourteenth embodiment of the frequency synthesizer according to the invention.

Hereinafter, the fourteenth embodiment will be described centering on different points between the above-mentioned third and seventh embodiments and the fourteenth embodiment, and the same points therebetween will not be described.

As shown in FIG. 40, the frequency synthesizer 1 of the fourteenth embodiment has the FDSM 11, the comparator 13, the loop filter 12, the control amount calculation section 6, and the digital control oscillator 17. The FDSM 11, the comparator 13, the loop filter 12, the control amount calculation section 6, and the digital control oscillator 17 are connected to the output side in this order.

As described above, in the present embodiment, the loop filter 12 is disposed on the next stage of the comparator 13, that is, between the comparator 13 and the digital control oscillator 17, more specifically, between the comparator 13 and the control amount calculation section 6.

In a manner similar to that of the third embodiment, the comparator 13 has the gain section 132 and the subtractor 131 (refer to FIG. 6), and is configured to perform signal processing through signed binary representation.

The control amount calculation section 6 is as described in the seventh embodiment. As the control amount calculation section 6, it is possible to use, for example, the control amount calculation section 6 or the like of the eighth to thirteenth embodiments. The control amount calculation section 6 has the same effect as that of each of the eighth to thirteenth embodiments.

According to the above-mentioned fourteenth embodiment, other than the effect caused by the position of the loop filter 12, the same effect as that of the above-mentioned seventh embodiment can be exhibited.

Regarding the effect caused from the position of the loop filter 12, it is also possible to exhibit the same effect as that of the above-mentioned third embodiment.

Fifteenth Embodiment

Figure 41:
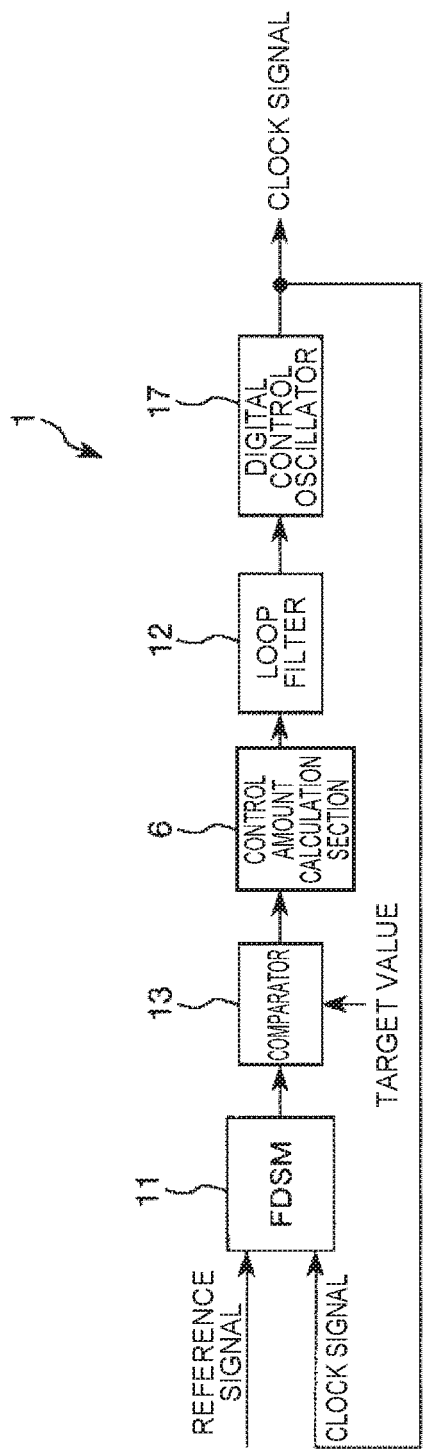
FIG. 41 is a block diagram illustrating a fifteenth embodiment of the frequency synthesizer according to the invention.

FIG. 41 is a block diagram illustrating a fifteenth embodiment of the frequency synthesizer according to the invention.

Hereinafter, the fifteenth embodiment will be described centering on different points between the above-mentioned third and seventh embodiments and the fifteenth embodiment, and the same points therebetween will not be described.

As shown in FIG. 41, the frequency synthesizer 1 of the fifteenth embodiment has the FDSM 11, the comparator 13, the control amount calculation section 6, the loop filter 12, and the digital control oscillator 17. The FDSM 11, the comparator 13, the control amount calculation section 6, the loop filter 12, and the digital control oscillator 17 are connected to the output side in this order.

As described above, in the present embodiment, the loop filter 12 is disposed on the next stage of the control amount calculation section 6, that is, between the control amount calculation section 6 and the digital control oscillator 17.

In a manner similar to that of the third embodiment, the comparator 13 has the gain section 132 and the subtractor 131 (refer to FIG. 6), and is configured to perform signal processing through signed binary representation.

The control amount calculation section 6 is as described in the seventh embodiment. As the control amount calculation section 6, it is possible to use, for example, the control amount calculation section 6 or the like of the eighth to thirteenth embodiments. The control amount calculation section 6 has the same effect as that of each of the eighth to thirteenth embodiments.

According to the above-mentioned fifteenth embodiment, other than the effect caused by the position of the loop filter 12, the same effect as that of the above-mentioned seventh embodiment can be exhibited.

Since the loop filter 12 is disposed on the next stage of the control amount calculation section 6, it is possible to effectively attenuate the frequency component that increases the phase noise of the digital control oscillator 17 including a quantization noise component and the like occurring in the comparator 13.

Calculation is performed in a state where the quantization error is large until being processed by the loop filter 12. However, it is possible to minimize the number of bits represented in the calculation. Therefore, the loop filter 12 is disposed on the next stage of the control amount calculation section 6, whereby it is possible to reduce the size of the calculation circuit in the range to the control amount calculation section 6.

By employing the signed binary representation, it is possible to take a negative value. Thereby, it is possible to reduce the number of elements or the sizes of elements in the circuit.

The frequency synthesizer according to the invention has been hitherto described on the basis of the embodiments shown in the drawing. However, the invention is not limited to this, and the configuration of each section can be replaced with an arbitrary configuration having the same function. Further, another arbitrary component may be added.

In the invention, two or more arbitrary configurations (characteristics) of the embodiments and the modification examples may be combined.

In the above-mentioned embodiment, two configuration examples of the frequency delta sigma modulation section have been given. However, in the invention, the configuration of the frequency delta sigma modulation section is not limited to this, and another configuration may be adopted.

In the above-mentioned embodiment, the frequency ratio measuring section is configured using the frequency delta sigma modulation section. However, the invention is not limited to this, and the frequency ratio measuring section may be configured using the frequency modulation section having, for example, another configuration.

In the above-mentioned embodiment, a divider is not provided. However, the invention is not limited to this, and a single divider or a plurality of dividers may be provided.

What is claimed is:

1. A frequency synthesizer comprising:
    an oscillating section that generates a first signal;
    a frequency ratio measuring section that measures a frequency ratio of the first signal and a second signal by using the first signal and the second signal;
    a comparing section that compares the frequency ratio, which is measured by the frequency ratio measuring section, with a target value of a frequency ratio; and
    a filter that (i) is disposed on a preceding stage of the comparing section and between the frequency ratio measuring section and the comparing section, (ii) receives an output of the frequency ratio measuring section corresponding to the measured frequency ratio, and (iii) provides, based on the output of the frequency ratio measuring section, a filtered output as an input to the comparing section,
    wherein a frequency of the first signal of the oscillating section is adjusted on the basis of a comparison result of the comparing section.

2. The frequency synthesizer according to claim 1, further comprising an integrating section that is interposed between the comparing section and the oscillating section,
    wherein a phase of the first signal of the oscillating section is adjusted on the basis of the comparison result of the comparing section.

3. The frequency synthesizer according to claim 1, wherein the comparing section performs signal processing through signed binary representation.

4. The frequency synthesizer according to claim 1, wherein the frequency ratio measuring section has a frequency delta sigma modulation section that performs frequency delta sigma modulation on one of the first signal and the second signal by using the other thereof.

5. The frequency synthesizer according to claim 4, wherein the frequency delta sigma modulation section outputs an output signal on the basis of a bit stream format.

6. The frequency synthesizer according to claim 4, wherein the frequency delta sigma modulation section outputs an output signal on the basis of a data stream format.

7. The frequency synthesizer according to claim 4, wherein the frequency ratio measuring section has a plurality of the frequency delta sigma modulation sections which are connected in parallel.

8. The frequency synthesizer according to claim 7, wherein the frequency ratio measuring section has a phase adjustment section that shifts a phase of at least one of the first signal or the second signal, which is input to the plurality of frequency delta sigma modulation sections, between the plurality of frequency delta sigma modulation sections.

9. The frequency synthesizer according to claim 1, wherein the oscillating section has a digital analog converter that converts a digital signal into an analog signal, and a voltage control oscillator.

10. The frequency synthesizer according to claim 1, wherein the oscillating section has a digital control oscillator.

11. A frequency synthesizer comprising:
    an oscillating section that generates a first signal;
    a frequency ratio measuring section that measures a frequency ratio of the first signal and a second signal by using the first signal and the second signal;
    a comparing section that compares the frequency ratio, which is measured by the frequency ratio measuring section, with a target value of a frequency ratio;
    a filter that is disposed on a preceding stage of the comparing section; and
    a control amount calculation section that calculates a control amount of the oscillating section on the basis of a comparison result of the comparing section,
    wherein the control amount calculation section includes at least two different circuit sections selected from a first circuit section that outputs a predetermined value times the comparison result of the comparing section, a second circuit section group that is formed of a plurality of second circuit sections each of which integrates the comparison result of the comparing section a different predetermined number of times, and a third circuit section group that is formed of a plurality of third circuit sections each of which integrates the comparison result of the comparing section a different predetermined number of times, and at least one of the frequency or the phase of the first signal of the oscillating section is adjusted on the basis of the control amount which is calculated by the control amount calculation section.

12. The frequency synthesizer according to claim 11, wherein the comparing section performs signal processing through signed binary representation.

* * * * *